United States Patent
Toda

(10) Patent No.: US 8,350,349 B2
(45) Date of Patent: Jan. 8, 2013

(54) SOLID-STATE IMAGING DEVICE, METHOD OF MANUFACTURING THEREOF, AND ELECTRONIC APPARATUS

(75) Inventor: Atsushi Toda, Kanagawa (JP)

(73) Assignee: Sony Corporation, Tokyo (JP)

( * ) Notice: Subject to any disclaimer, the term of this patent is extended or adjusted under 35 U.S.C. 154(b) by 140 days.

(21) Appl. No.: 13/013,981

(22) Filed: Jan. 26, 2011

(65) Prior Publication Data

US 2011/0186952 A1    Aug. 4, 2011

(30) Foreign Application Priority Data

Feb. 2, 2010    (JP) ................... 2010-021219

(51) Int. Cl.
*H01L 27/00* (2006.01)
*H01L 31/18* (2006.01)

(52) U.S. Cl. . 257/432; 257/292; 257/461; 257/E27.135; 257/E31.127; 438/69; 438/71; 250/216; 348/276

(58) Field of Classification Search .................. 257/292, 257/432, 461, E27.135, E31.127; 438/69, 438/71

See application file for complete search history.

(56) References Cited

U.S. PATENT DOCUMENTS

| | | | | |
|---|---|---|---|---|
| 2008/0030603 A1* | 2/2008 | Masuno et al. | ................ | 348/273 |
| 2009/0008735 A1* | 1/2009 | Ogino et al. | ................ | 257/436 |
| 2010/0059847 A1* | 3/2010 | Nasuno et al. | ................ | 257/458 |
| 2010/0220377 A1* | 9/2010 | Yamada et al. | ................ | 359/241 |
| 2011/0304753 A1* | 12/2011 | Shintani | ................ | 348/279 |

FOREIGN PATENT DOCUMENTS

| | | |
|---|---|---|
| JP | 2005-347386 | 12/2005 |
| JP | 2005-353626 | 12/2005 |
| JP | 2008-258474 | 10/2008 |

\* cited by examiner

*Primary Examiner* — Thanh V Pham
(74) *Attorney, Agent, or Firm* — SNR Denton US LLP

(57) ABSTRACT

Provided is a solid-state imaging device including a first photoelectric-conversion-portion selectively receiving a first wavelength light in incident light and performing photoelectric conversion; and a second photoelectric-conversion-portion selectively receiving a second wavelength light which is shorter than the first wavelength, wherein the first photoelectric-conversion-portion is laminated above the second photoelectric-conversion-portion in an imaging area of a substrate so that the second photoelectric-conversion-portion receives the light transmitting the first photoelectric-conversion-portion, wherein a transmitting portion is formed in the first photoelectric-conversion-portion so that the second wavelength light transmits the second photoelectric-conversion-portion more than other portions, and wherein the transmitting portion is formed to include a portion satisfying the following Equation within a width D defined in the direction of the imaging area, a refraction index n of a peripheral portion of the transmitting portion, and the longest wavelength λc of the second wavelength range selectively photoelectrically-converted in the second photoelectric-conversion-portion:

$\lambda c/n \leq 2D$.

11 Claims, 20 Drawing Sheets

FIG. 9
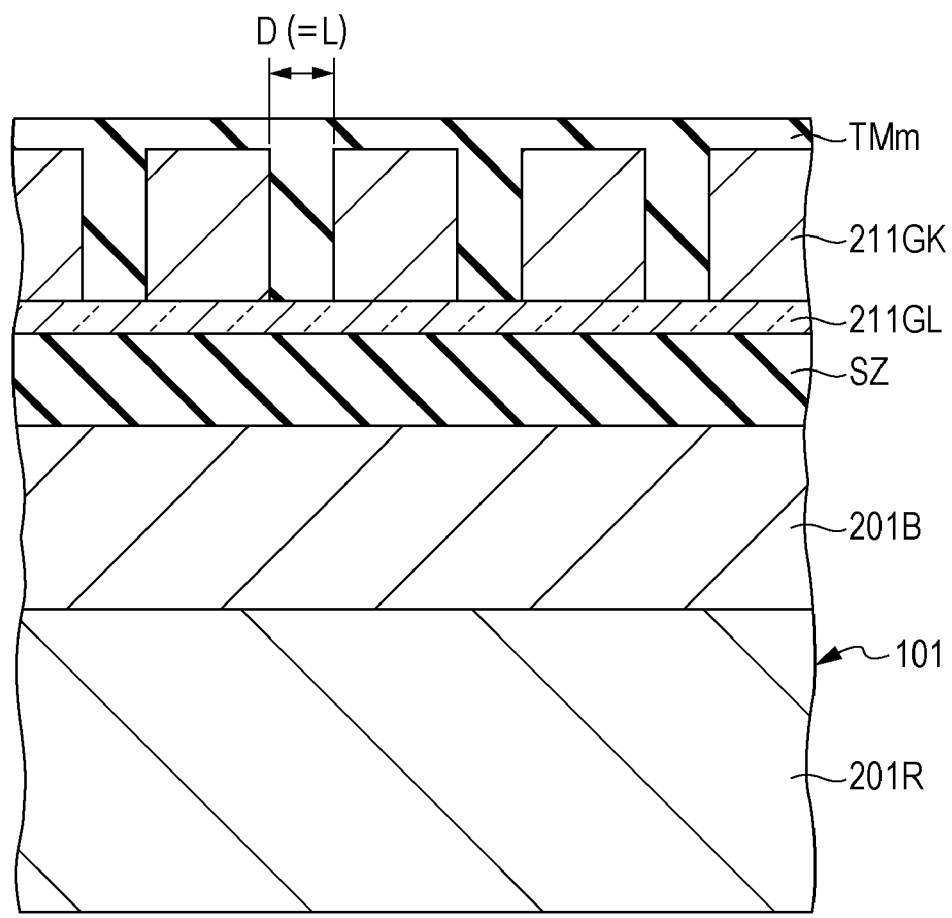
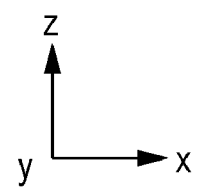

SOLID-STATE IMAGING DEVICE, METHOD OF MANUFACTURING THEREOF, AND ELECTRONIC APPARATUS

BACKGROUND OF THE INVENTION

1. Field of the Invention

The present invention relates to a solid-state imaging device, a method of manufacturing thereof, and an electronic apparatus.

2. Description of the Related Art

Electronic apparatuses such as a digital video camera and a digital still camera include solid-state imaging devices. For example, as the solid-state imaging device, a CMOS (Complementary Metal Oxide Semiconductor) type image sensor, a CCD (Charge Coupled Device) type image sensor, or the like is included.

In the solid-state imaging device, a plurality of pixels is arrayed in a matrix shape on an imaging area of a semiconductor substrate. Each pixel is provided with a photoelectric conversion portion. For example, photodiodes are disposed as the photoelectric conversion portions.

Among solid-state imaging devices, in the CMOS type image sensor, the pixel is configured to include semiconductor devices such as a pixel transistor other than the photoelectric conversion portion. With respect to the pixel transistors, a plurality of transistors are configured so as to read out signal charges generated by the photoelectric conversion portions and to output electric signals to signal lines.

In the solid-state imaging device, when photographing a color image, the photoelectric conversion portion generally receives light incident through color filters on a light-receiving plane and performs photoelectric conversion to generate the signal charges.

For example, the color filters of the three primary colors of red, green, and blue are disposed in a Bayer array on the imaging area, so that light of each color transmitting the color filter of each color is received by the photoelectric conversion portion in each pixel. In other words, by considering the pixel which the red color filter is disposed above, among the light incident as a subject image, the light of the green and blue components are absorbed and only the light of the red component transmits the red color filter, so that the transmitted red light is received by the photoelectric conversion portion disposed at the lower layer thereof.

Miniaturization of the solid-state imaging device and an increase in the number of pixels are necessary. Therefore, as the size of one pixel is further reduced, it is difficult to receive a sufficient light amount, and the image quality of the photographed image is not easily improved.

In order to solve these problems, a "lamination type" is proposed where the photoelectric conversion portions which selectively receive the light of the colors are not disposed in the direction parallel to the imaging area but the photoelectric conversion portions of the colors are disposed to be laminated in the direction perpendicular to the imaging area.

In the "lamination type", for example, it is proposed that three layers of the organic photoelectric conversion layers are laminated as the photoelectric conversion portion so as to sequentially receive the three primary color light included in the incident light. In this case, a portion of the incident light is absorbed in the photoelectric conversion portion disposed in the upper portion so that the photoelectric conversion is performed. Then, a portion of the light which is not absorbed in the photoelectric conversion portion disposed in the upper portion is absorbed in another photoelectric conversion portion disposed in the lower portion so that the photoelectric conversion is performed. For example, the photoelectric conversion portion of the uppermost layer absorbs green light; the photoelectric conversion portion of the middle layer absorbs blue light; and the photoelectric conversion portion of the lowermost layer absorbs red light. In addition, in each photoelectric conversion portion, the photoelectric conversion is performed so that signal charges are generated (for example, refer to Japanese Unexamined Patent Application Publication No. 2005-347386).

Besides, in the "lamination type", for example, it is proposed that a photoelectric conversion portion is disposed in an internal portion of the semiconductor substrate and an organic photoelectric conversion layer as a photoelectric conversion portion is disposed above thereof. For example, it is proposed that photodiodes receiving blue light and red light are formed at different depths in the semiconductor substrate and a photoelectric conversion layer receiving green light is formed on the surface of the semiconductor substrate (for example, refer to Japanese Unexamined Patent Application Publication Nos 2005-353626 and 2008-258474).

In this manner, in the "lamination type", each pixel receives not only mono-colored light but also a plurality of colored light. Therefore, it is possible to improve the light usage efficiency, so that it is possible to easily implement miniaturization. For example, in the case where three organic photoelectric conversion layers are laminated to receive the three primary color light of red, green, and blue, since the light usage efficiency is increased by three times, the area per pixel may be reduced, for example, by ⅓ times. In addition, in the case of the "lamination type", since a demosaic process is not necessary in comparison with the case where pixels are arrayed in a Bayer array, it is possible to suppress the occurrence of a false color.

SUMMARY OF THE INVENTION

For example, quinacridone is used to form the aforementioned organic photoelectric conversion layer.

FIG. 21 is a diagram illustrating a measurement result of an external quantum efficiency of the organic photoelectric conversion layer formed by using quinacridone. In FIG. 21, the horizontal axis represents a wavelength (nm) of light, and the vertical axis represents the external quantum efficiency.

As illustrated in FIG. 21, the organic photoelectric conversion layer formed by using quinacridone has high external quantum efficiency and high sensitivity in the green wavelength range.

However, as illustrated in FIG. 21, besides the green wavelength range, the organic photoelectric conversion layer has some degrees of sensitivity in the blue wavelength range.

Therefore, in the "lamination type", there is a case where the color reproducibility is not sufficient. In addition, accordingly, there is a case where a linear matrix coefficient of a calculation signal process of color correction is increased, and noise amplification occurs due to the calculation signal process, such that the image quality may be deteriorated.

In addition, since the blue light is absorbed in the photoelectric conversion portion which receives the green light, the amount of the blue light incident to the photoelectric conversion portion which is disposed at the lower layer to receive the blue light is decreased. Therefore, there is a case where the white balance coefficient is increased together with the deterioration in the color balance and noise amplification occurs due to the calculation, such that the image quality may be deteriorated.

In this manner, in the "lamination type" solid-state imaging device, there is a case where, after the photoelectric conversion portion of the upper layer receives light having a long wavelength, if the photoelectric conversion portion disposed at the lower layer is to receive the light having a short wavelength transmitting the photoelectric conversion portion of the upper layer, the image quality may not be sufficient. The same problems may also occur in the case where the photoelectric conversion portion is formed by using an inorganic material besides the case where the photoelectric conversion portion is formed by using an organic material.

Therefore, it is desirable to provide a solid-state imaging device, a method of manufacturing thereof, and an electronic apparatus capable of improving image quality of a photographed image.

According to the invention, there is provided a solid-state imaging device including: at least a first photoelectric conversion portion which selectively receives light of a first wavelength range in incident light and performs photoelectric conversion; and a second photoelectric conversion portion which selectively receives light of a second wavelength range which is shorter than the first wavelength range in the incident light, wherein the first photoelectric conversion portion is laminated above the second photoelectric conversion portion in an imaging area of a substrate so that the second photoelectric conversion portion receives the light transmitted by the first photoelectric conversion portion, wherein a transmitting portion is formed in the first photoelectric conversion portion so that the light of the second wavelength range transmits the second photoelectric conversion portion more than other portions, and wherein the transmitting portion is formed to include a portion satisfying the following Equation (1) within a width D which is defined in the direction of the imaging area of the substrate, a refraction index n of a peripheral portion of the transmitting portion, and the longest wavelength λc of the second wavelength range which is selectively photoelectrically converted in the second photoelectric conversion portion.

$$\lambda c/n \leq 2D \tag{1}$$

According to the invention, there is provided a method of manufacturing a solid-state imaging device including a step of manufacturing the solid-state imaging device including at least a first photoelectric conversion portion which selectively receives light of a first wavelength range in incident light and performs photoelectric conversion and a second photoelectric conversion portion which selectively receives light of a second wavelength range which is shorter than the first wavelength range in the incident light, wherein the first photoelectric conversion portion is laminated above the second photoelectric conversion portion in an imaging area of a substrate so that the second photoelectric conversion portion receives the light transmitted by the first photoelectric conversion portion, wherein the step of manufacturing the solid-state imaging device includes the step of forming a transmitting portion in the first photoelectric conversion portion so that the light of the second wavelength range transmits the second photoelectric conversion portion more than other portions, wherein in the step of forming of the transmitting portion, the transmitting portion is formed to include a portion satisfying the following Equation (1) within a width D which is defined in the direction of the imaging area of the substrate, a refraction index n of a peripheral portion of the transmitting portion, and the longest wavelength λc of the second wavelength range which is selectively photoelectrically converted in the second photoelectric conversion portion.

$$\lambda c/n \leq 2D \tag{1}$$

According to the invention, there is provided an electronic apparatus including: at least a first photoelectric conversion portion which selectively receives light of a first wavelength range in incident light and performs photoelectric conversion; and a second photoelectric conversion portion which selectively receives light of a second wavelength range which is shorter than the first wavelength range in the incident light, wherein the first photoelectric conversion portion is laminated above the second photoelectric conversion portion in an imaging area of a substrate so that the second photoelectric conversion portion receives the light transmitted by the first photoelectric conversion portion, wherein a transmitting portion is formed in the first photoelectric conversion portion so that the light of the second wavelength range transmits the second photoelectric conversion portion more than other portions, and wherein the transmitting portion is formed to include a portion satisfying the following Equation (1) within a width D which is defined in the direction of the imaging area of the substrate, a refraction index n of a peripheral portion of the transmitting portion, and the longest wavelength λc of the second wavelength range which is selectively photoelectrically converted in the second photoelectric conversion portion.

$$\lambda c/n \leq 2D \tag{1}$$

In the present invention, the transmitting portion is formed to include a portion satisfying the Equation (1) within a width D which is defined in the direction of the imaging area of the substrate, a refraction index n of the peripheral portion of the transmitting portion, and the longest wavelength λc of the second wavelength range which is selectively photoelectrically converted in the second photoelectric conversion portion.

According to the invention, it is possible to provide a solid-state imaging device, a method of manufacturing thereof, and an electronic apparatus capable of improving image quality of a photographed image.

BRIEF DESCRIPTION OF THE DRAWINGS

FIG. 9 is a diagram illustrating a method of manufacturing a solid-state imaging device according to the first embodiment of the invention.

DESCRIPTION OF THE PREFERRED EMBODIMENTS

Hereinafter, embodiments of the invention will be described with reference to the drawings.

In addition, the description is made in the following order.
1. First Embodiment (Case where Transmitting Window has a Cylindrical Shape)
2. Second Embodiment (Case where Transmitting Window is Formed to Surround Photoelectric Conversion Layer)
3. Third Embodiment (Case where Transmitting Window has a Rectangular Parallelepiped Shape)
4. Others 1. First Embodiment (A) Configuration of Device
(A-1) Configuration of Main Components of Camera FIG. 1 is a configurational diagram illustrating a configuration of a camera 40 according to a first embodiment of the invention.

Figure 1:
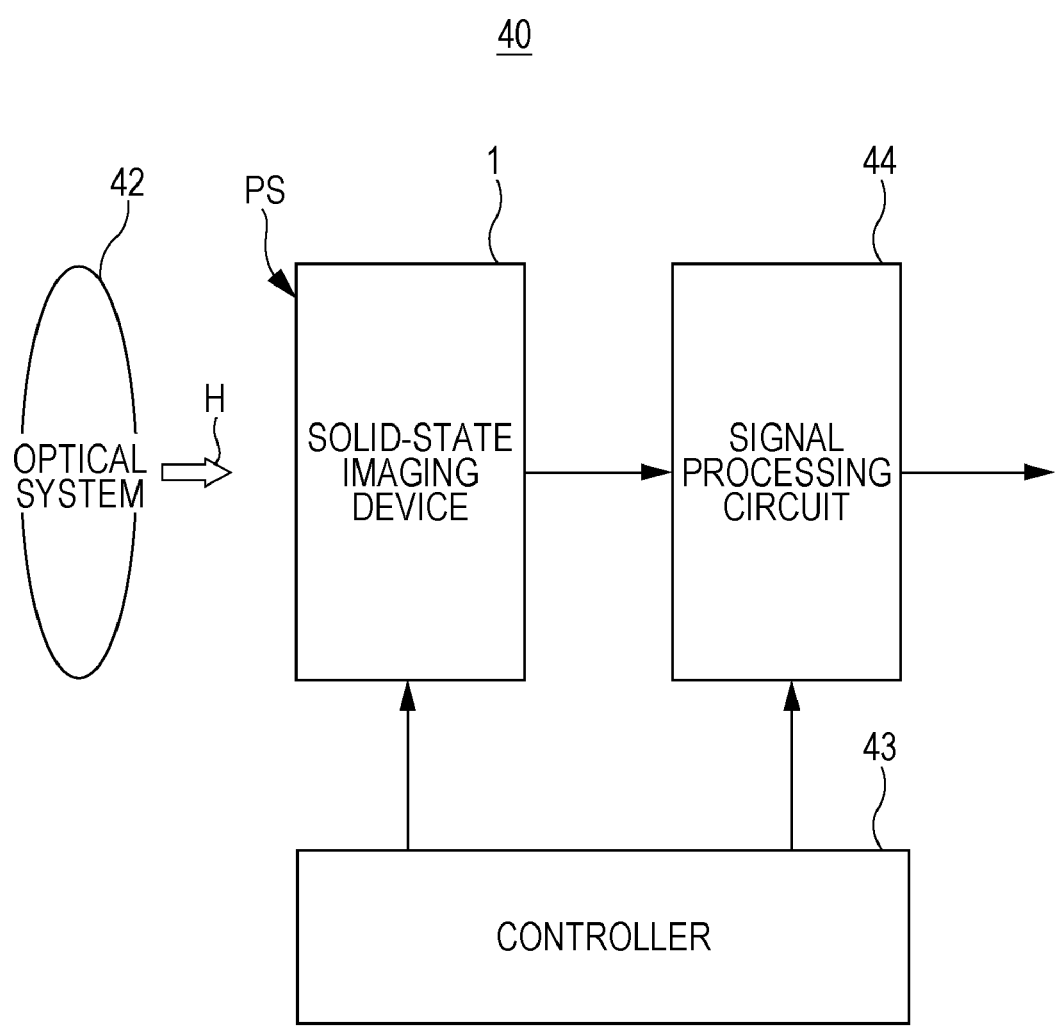
FIG. 1 is a configurational diagram illustrating a configuration of a camera according to a first embodiment of the invention.

As illustrated in FIG. 1, the camera 40 includes a solid-state imaging device 1, an optical system 42, a controller 43, and a signal processing circuit 44. These components are sequentially described.

In the solid-state imaging device 1, light (subject image) H incident through the optical system 42 is sensed by an imaging area PS, and signal charges are generated by photoelectric conversion. Herein, the solid-state imaging device 1 is driven based on a control signal output from the controller 43. More specifically, the signal charges are read out and output as raw data.

The optical system 42 includes optical members such as an imaging lens or a diaphragm and is disposed so that light H incident as a subject image is focused on an imaging area PS of the solid-state imaging device 1.

The controller 43 outputs various types of control signals to the solid-state imaging device 1 and the signal processing circuit 44 so as to control the solid-state imaging device 1 and the signal processing circuit 44 to be driven.

The signal processing circuit 44 is configured to generate a digital image with respect to the subject image by performing a signal process on the raw data output from the solid-state imaging device 1.
(A-2) Configuration of Main Components of Solid-State Imaging Device An overall configuration of the solid-state imaging device 1 will be described.

Figure 2:
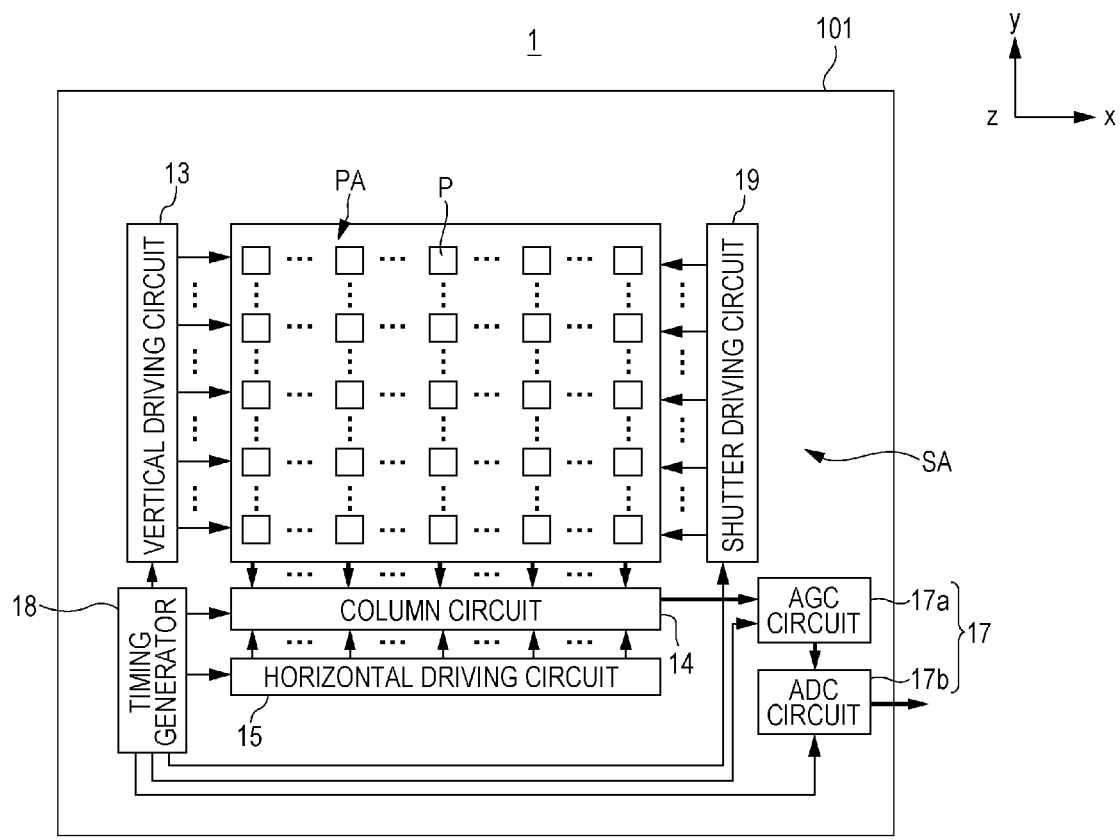
FIG. 2 is a block diagram illustrating an overall configuration of a solid-state imaging device according to the first embodiment of the invention.

FIG. 2 is a block diagram illustrating an overall configuration of a solid-state imaging device 1 according to the first embodiment of the invention.

The solid-state imaging device 1 is configured as, for example, a CMOS type image sensor. As illustrated in FIG. 2, the solid-state imaging device 1 includes a substrate 101. The substrate 101 is, for example, a semiconductor substrate made of silicon, and as illustrated in FIG. 2, a photographing area PA and a peripheral area SA are disposed on a surface of the substrate 101.

As illustrated in FIG. 2, the photographing area PA has a rectangular shape, and a plurality of pixels P are disposed in the horizontal direction x and the vertical direction y. In other words, the pixels P are aligned in a matrix shape. In addition, the photographing area PA corresponds to the imaging area PS illustrated in FIG. 1. Details of the pixels P will be described later.

As illustrated in FIG. 2, the peripheral area SA is located in the peripheral portion of the photographing area PA. In addition, peripheral circuits are disposed in the peripheral area SA.

More specifically, as illustrated in FIG. 2, a vertical driving circuit 13, a column circuit 14, a horizontal driving circuit 15, an external output circuit 17, a timing generator 18, and a shutter driving circuit 19 are disposed as the peripheral circuits.

As illustrated in FIG. 2, the vertical driving circuit 13 is disposed in the side portion of the photographing area PA in the peripheral area SA to selectively drive the pixels P of the photographing area PA in units of a row.

As illustrated in FIG. 2, the column circuit 14 is disposed in the lower end portion of the photographing area PA in the peripheral area SA to perform a signal process on the signal output from the pixels P in units of a column. Herein, the column circuit 14 includes a CDS (Correlated Double Sampling) circuit (not shown) to perform a signal process of removing fixed pattern noise.

As illustrated in FIG. 2, the horizontal driving circuit 15 is electrically connected to the column circuit 14. The horizontal driving circuit 15 includes, for example, a shift register to sequentially output signals stored in each column of pixels P in the column circuit 14 to the external output circuit 17.

As illustrated in FIG. 2, the external output circuit 17 is electrically connected to the column circuit 14 to perform a signal process on the signal output from the column circuit 14 and, after that, output the processed signal. The external output circuit 17 includes an AGC (Automatic Gain Control) circuit 17a and an ADC circuit 17b. In the external output circuit 17, the AGC circuit 17a applies a gain to a signal, and after that, the ADC circuit 17b converts an analog signal into a digital signal and outputs the digital signal to an external portion.

As illustrated in FIG. 2, the timing generator 18 is electrically connected to each of the vertical driving circuit 13, the column circuit 14, the horizontal driving circuit 15, the external output circuit 17, and the shutter driving circuit 19. The timing generator 18 generates various types of pulse signals and outputs the pulse signals to the vertical driving circuit 13, the column circuit 14, the horizontal driving circuit 15, the external output circuit 17, and the shutter driving circuit 19 to perform driving control for each component.

The shutter driving circuit 19 is configured to select the pixels P in unit of a row and adjust exposing time with respect to the pixels P.

The aforementioned components are simultaneously driven with respect to the pixels P which are aligned in unit of a row. More specifically, the pixels P are sequentially selected in the vertical direction y in unit of a horizontal line (pixel row) by the selection signals supplied from the aforementioned vertical driving circuit 13. In addition, each of the pixels P is driven by various types of timing signals output from the timing generator 18. Accordingly, electric signals output from the pixels P are read out to the column circuit 14 through vertical signal lines 27 in a unit of a pixel column. In addition, the signals stored in the column circuit 14 are selected by the horizontal driving circuit 15 to be sequentially output to the external output circuit 17.

(A-3) Pixel Configuration of Solid-State Imaging Device

A pixel configuration of the solid-state imaging device 1 according to the embodiment will be described.

Figure 3:
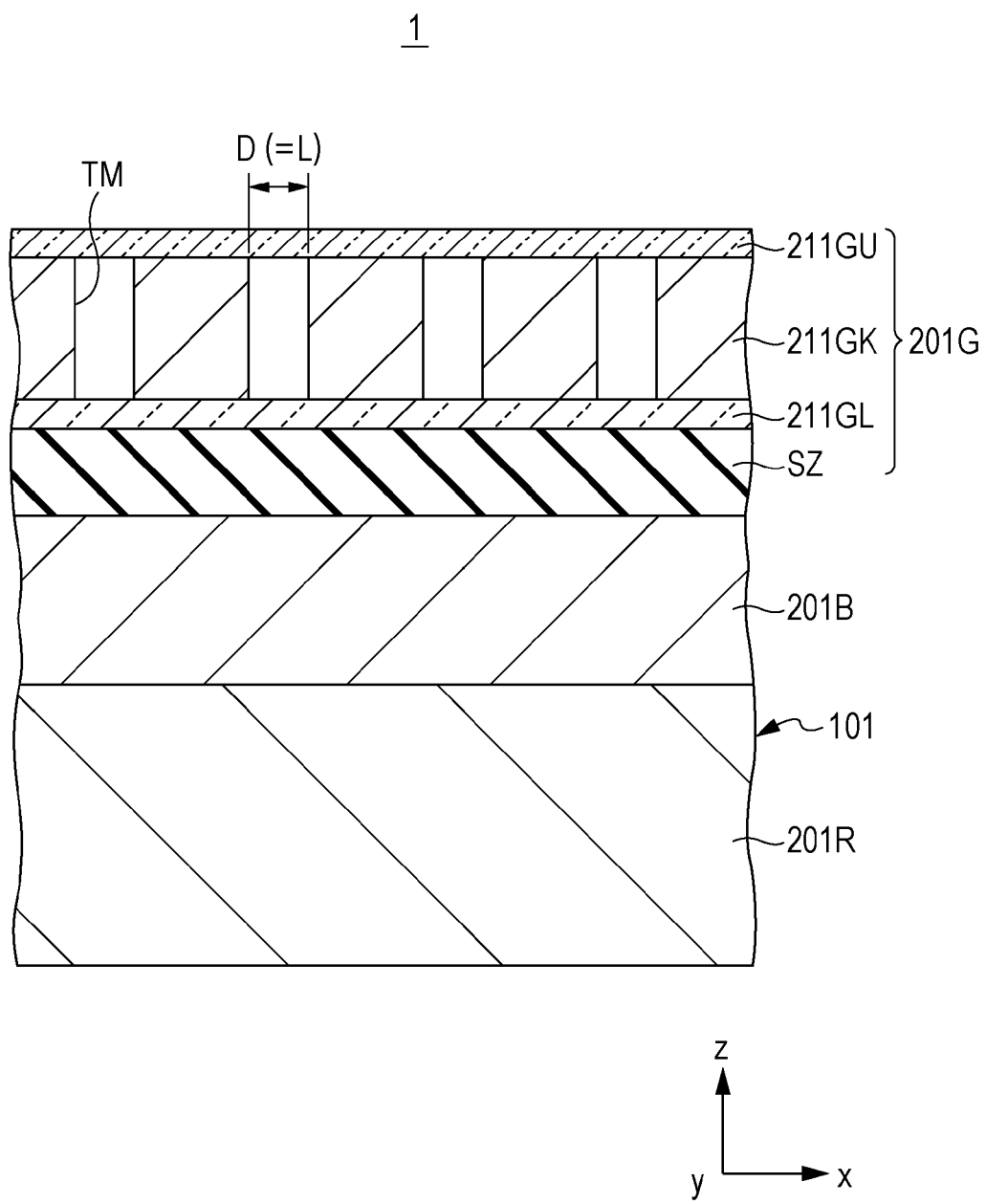
FIG. 3 is a diagram illustrating main components of a pixel constituting a solid-state imaging device according to the first embodiment of the invention.

FIG. 3 is a diagram illustrating main components of a pixel constituting the solid-state imaging device according to the first embodiment of the invention. Herein, FIG. 3 illustrates a cross section.

As illustrated in FIG. 3, the solid-state imaging device 1 is a "lamination type", and a plurality of photoelectric conversion portions 201G, 201B, and 201R are disposed to be laminated. Herein, a green photoelectric conversion portion 201G, a blue photoelectric conversion portion 201B, and a red photoelectric conversion portion 201R are included, and each photoelectric conversion portion is disposed corresponding to each pixel P.

As illustrated in FIG. 3, the solid-state imaging device 1 includes a substrate 101, and the green photoelectric conversion portion 201G is disposed at the upper surface side of the substrate 101. In addition, the blue photoelectric conversion portion 201B and the red photoelectric conversion portion 201R are sequentially disposed from the upper surface to the lower surface in the internal portion of the substrate 101.

In the solid-state imaging device 1, light as a subject image is incident from the upper portion, and the green photoelectric conversion portion 201G, the blue photoelectric conversion portion 201B, and the red photoelectric conversion portion 201R sequentially receive the incident light.

More specifically, the green photoelectric conversion portion 201G of the uppermost layer receives the light of the green component in the incident light with high sensitivity to perform photoelectric conversion and transmits most of light other than the green component. In addition, the blue photoelectric conversion portion 201B receives the light of the blue component within the light transmitted by the green photoelectric conversion portion 201G with high sensitivity to perform photoelectric conversion and transmits most of light other than the blue component. In addition, the red photoelectric conversion portion 201R receives the light of the red component within the light transmitted by the blue photoelectric conversion portion 201B with high sensitivity to perform photoelectric conversion.

The components constituting the solid-state imaging device 1 will be sequentially described.

(A-3-1) Green Photoelectric Conversion Portion 201G

In the solid-state imaging device 1, as illustrated in FIG. 3, the green photoelectric conversion portion 201G is disposed on the upper surface of the substrate 101 through an insulating layer SZ.

The green photoelectric conversion portion 201G includes an organic photoelectric conversion layer 211GK, an upper portion electrode 211GU, and a lower portion electrode 211GL, which are disposed in the order of: the lower portion electrode 211GL, the organic photoelectric conversion layer 211GK, and the upper portion electrode 211GU from the side of the insulating layer SZ.

In the green photoelectric conversion portion 201G, as illustrated in FIG. 3, the organic photoelectric conversion layer 211GK is disposed on the upper surface of the insulating layer SZ to be interposed between the upper portion electrode 211GU and the lower portion electrode 211GL. The organic photoelectric conversion layer 211GK is configured to selectively absorb the light of the green component included in the incident light to perform photoelectric conversion, so that the signal charges are generated. In other words, the organic photoelectric conversion layer 211GK is configured to receive the light in the green wavelength range in the incident light incident from the upper surface with high sensitivity to perform photoelectric conversion. In addition, the organic photoelectric conversion layer 211GK is configured so as to allow more light other than the green component included in the incident light to be transmitted than the light of the green component. For example, the organic photoelectric conversion layer 211GK is formed by using an organic photoelectric conversion material including a polycyclic series organic pigment such as quinacridone series. Besides the quinacridone, the organic photoelectric conversion layer 211GK may be configured to include a rhodamine series pigment or a melacyanine series pigment.

In the green photoelectric conversion portion 201G, as illustrated in FIG. 3, the upper portion electrode 211GU is disposed on the upper surface of the organic photoelectric conversion layer 211GK. The upper portion electrode 211GU is a transparent electrode which transmits the incident light and is formed by using, for example, a transparent conductive material such as indium tin oxide (ITO) and indium zinc oxide. The upper portion electrode 211GU is formed, for example, by forming a layer according to a layer formation method such as a sputtering method.

In the green photoelectric conversion portion 201G, as illustrated in FIG. 3, the lower portion electrode 211GL is disposed on the upper surface of the insulating layer SZ. Similarly to the upper portion electrode 211GU, the lower portion electrode 211GL is a transparent electrode which transmits the incident light and is formed by using, for example, a transparent conductive material such as indium tin oxide (ITO) and indium zinc oxide. The lower portion electrode 211GL is formed, for example, by forming a layer according to a layer formation method such as a sputtering method.

In the embodiment, as illustrated in FIG. 3, transmitting windows TM are disposed in the organic photoelectric conversion layer 211GK. As illustrated in FIG. 3, the transmitting windows TM are disposed to penetrate the organic photoelectric conversion layer 211GK from the upper surface to the lower surface.

Figure 4:
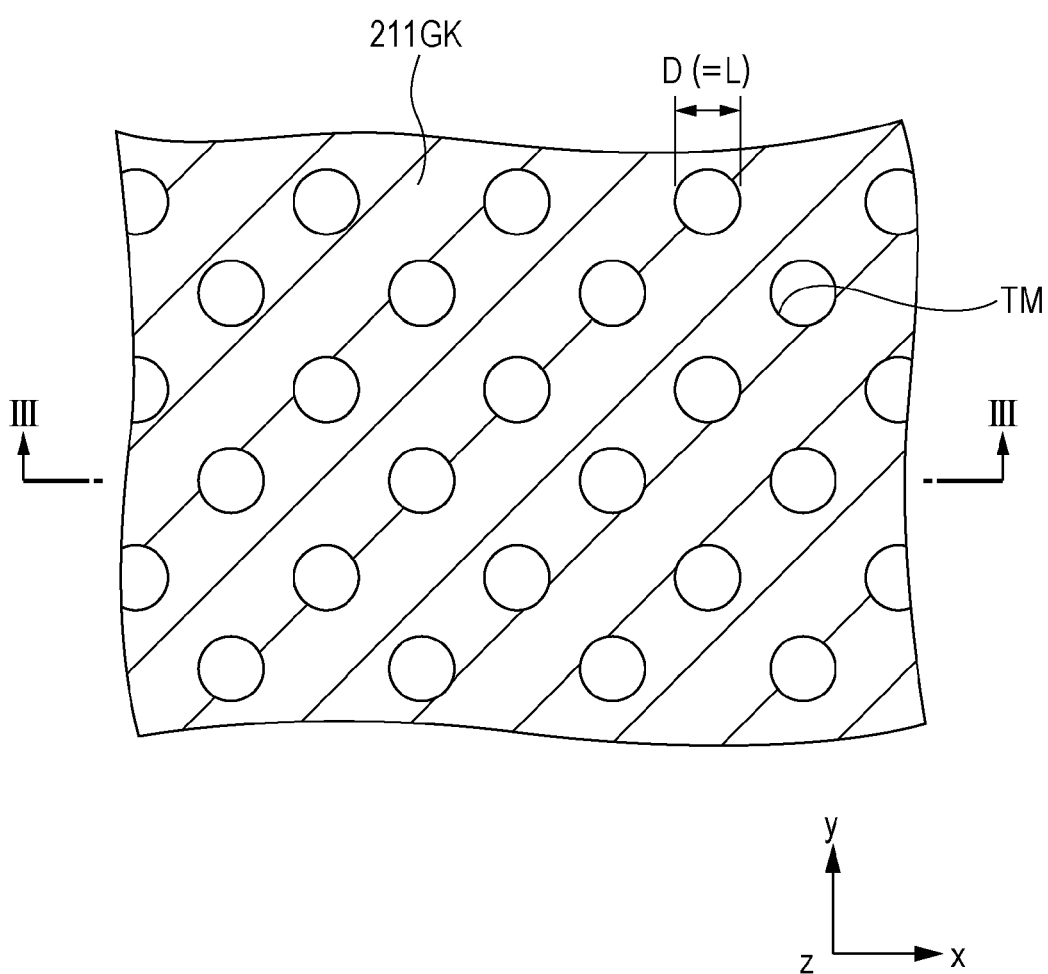
FIG. 4 is a diagram illustrating an organic photoelectric conversion layer according to the first embodiment of the invention.

FIG. 4 is a diagram illustrating the organic photoelectric conversion layer 211GK according to the first embodiment of the invention. FIG. 4 illustrates an upper surface of the organic photoelectric conversion layer 211GK, and the III-III portion corresponds to FIG. 3.

As illustrated in FIG. 4, in the organic photoelectric conversion layer 211GK, a plurality of the transmitting windows TM are arrayed in a plane direction (xy plane) of the substrate 101. As illustrated in FIG. 4, the transmitting window TM is formed so that the planar shape is a circle.

In other words, as seen from FIGS. 3 and 4, the transmitting window TM is formed in a cylindrical shape followed by an outer circumferential surface so that the upper surface and the lower surface are aligned in the direction z perpendicular to the surface of the substrate 101.

With respect to the transmitting window TM, an opening is disposed in the organic photoelectric conversion layer 211GK, and for example, an insulating material is buried inside the opening.

In addition, each transmitting window TM is formed so that greater amount of the light of the wavelength range, which is selectively received in the blue photoelectric conversion portion 201B disposed at the lower layer of the green photoelectric conversion portion 201G to be photoelectrically converted, is allowed to transmit more than the portions other than transmitting window TM of the organic photoelectric conversion layer 211GK. In other words, each transmitting window TM is configured so that the absorbance of the light of which the wavelength is shorter than that of the light of the wavelength range photoelectrically converted with high sensitivity by the green photoelectric conversion portion 201G and of which the wavelength range is photoelectrically converted with high sensitivity by the blue photoelectric conversion portion 201B is decreased in comparison with the case where there is no transmitting window TM.

More specifically, according to the "waveguide theory", each of the transmitting windows TM is formed so as to include the portions where the width D defined in the plane direction of the substrate 101 satisfies the following Equation (1). In addition, each of the transmitting windows TM is also formed so that the maximum width L defined in the plane direction of the substrate 101 satisfies the following Equation (2). In other words, as described above, the cylinder-shaped transmitting window TM is formed so that the diameter thereof corresponds to the widths D and L in the following Equations (1) and (2).

$$\lambda c/n \leq 2D \quad (1)$$

$$\lambda c/n \leq 2L \quad (2)$$

In the above Equations (1) and (2), n represents a refraction index of the peripheral portion of the transmitting window TM. More specifically, n is an effective refraction index including the organic photoelectric conversion layer 211GK located in the peripheral portion of the side surface of the transmitting window TM, the upper portion electrode 211GU located in the upper surface, and the lower portion electrode 211GL located in the lower surface. The effective refraction index described herein is an effective refraction index as an optical field of a wavelength-order area. Therefore, in the embodiment, the effective refraction index is a central value of the refraction index values of the organic photoelectric conversion layer 211GK, the upper portion electrode 211GU, and the lower portion electrode 211GL.

In addition, λc represents the longest wavelength (cut-off wavelength) of the absorbed wavelength range which is desired to be reduced in the incident light incident to the organic photoelectric conversion layer 211GK of the green photoelectric conversion portion 201G. Therefore, if the longest wavelength of the blue wavelength which is selectively received and photoelectrically converted by the blue photoelectric conversion portion 201B disposed at a lower layer of the green photoelectric conversion portion 201G is set as the cut-off wavelength λc to define a width D, the greater amount of the blue light is transmitted according to the "waveguide theory".

Figure 5:
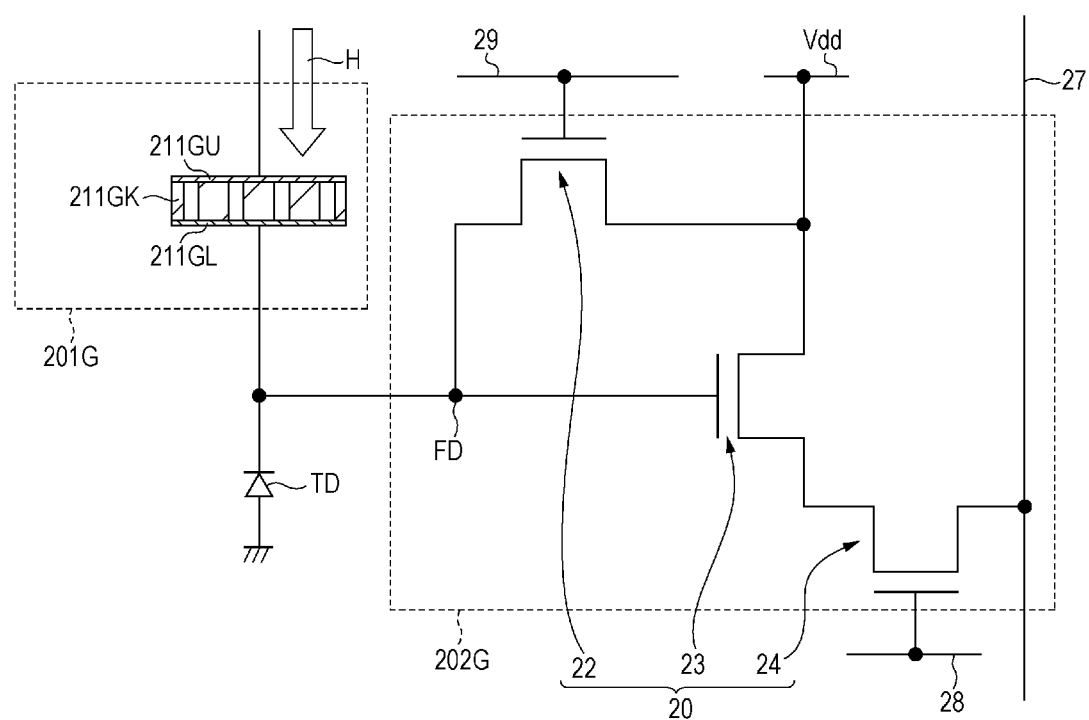
FIG. 5 is a circuit diagram illustrating a circuit configuration of a green photoelectric conversion portion according to the first embodiment of the invention.

FIG. 5 is a circuit diagram illustrating a circuit configuration of the green photoelectric conversion portion 201G according to the first embodiment of the invention.

As illustrated in FIG. 5, in the green photoelectric conversion portion 201G, the pixels are configured so that electric signals according to the signal charges generated by the organic photoelectric conversion layer 211GK are read out by the green reading circuit portion 202G. In the green photoelectric conversion portion 201G, the organic photoelectric conversion layer 211GK is applied with a voltage by the lower portion electrode 211GL and the upper portion electrode 211GU. Then, the signal charges generated by the organic photoelectric conversion layer 211GK are read out by the green reading circuit portion 202G.

As illustrated in FIG. 5, the green reading circuit portion 202G includes a reading circuit 20.

The reading circuit 20 is disposed for each pixel P and is configured to read the signal charges generated by the organic photoelectric conversion layer 211GK in each pixel P. Although not illustrated in FIG. 3, for example, in the surface of the substrate 101, the reading circuits 20 are disposed in the boundary portions of a plurality of the pixels and are covered with insulating layers SZ.

In the embodiment, as illustrated in FIG. 5, the reading circuit 20 includes a reset transistor 22, an amplification transistor 23, and a selection transistor 24 and is configured as a 3 transistor type CMOS signal reading circuit. In other words, the signal charges generated by the green photoelectric conversion portion 201G are transferred and stored in a storage diode TD formed in the substrate 101 and are read out by the reading circuit 20 constructed with the three transistors.

In the green reading circuit portion 202G, the reset transistor 22 is configured so as to reset the gate voltage of the amplification transistor 23.

More specifically, as illustrated in FIG. 5, the gate of the reset transistor 22 is connected to a reset line 29 to which the row reset signal is supplied. In addition, the drain of the reset transistor 22 is connected to a power voltage supply line Vdd, and the source thereof is connected to a floating diffusion FD. In addition, the reset transistor 22 resets the gate voltage of the amplification transistor 23 to the power voltage through the floating diffusion FD based on the row reset signal input from the reset line 29.

In the green reading circuit portion 202G, the amplification transistor 23 is configured to amplify and output the electric signals according to the signal charges generated by the green organic photoelectric conversion layer 211GK.

More specifically, as illustrated in FIG. 5, the gate of the amplification transistor 23 is connected to a floating diffusion FD. In addition, the drain of the amplification transistor 23 is connected to a power voltage supply line Vdd, and the source thereof is connected to a selection transistor 24.

In the green reading circuit portion 202G, the selection transistor 24 is configured to output the electric signals output by the amplification transistor 23 to the vertical signal line 27 when the row selection signal is input.

More specifically, as illustrated in FIG. 5, the gate of the selection transistor 24 is connected to an address line 28 to which the selection signal is supplied. When the selection signal is supplied, the selection transistor 24 is set in the ON state to output the output signal amplified by the amplification transistor 23 to the vertical signal line 27 as described above.

(A-3-2) Blue Photoelectric Conversion Portion 201B

In the solid-state imaging device 1, as illustrated in FIG. 3, the blue photoelectric conversion portion 201B is disposed in an inner portion of the substrate 101. Herein, the blue photoelectric conversion portion 201B is formed to be disposed in the surface side shallower than the red photoelectric conversion portion 201R.

A plurality of the blue photoelectric conversion portions 201B is disposed so as to correspond to a plurality of the pixels P. In other words, the blue photoelectric conversion portions 201B are disposed to be aligned in the horizontal direction x and the vertical direction y perpendicular to the horizontal direction x in the imaging area (xy plane).

The blue photoelectric conversion portion 201B is a photodiode which has a pn junction in the internal portion of the substrate 101. The blue photoelectric conversion portion 201B selectively absorbs the light of the blue component in the incident light (subject image) and performs photoelectric conversion, so that signal charges are generated. In other words, the blue photoelectric conversion portion 201B is configured to receive the light of the blue wavelength range within the light transmitted by the green photoelectric conversion portion 201G of the upper layer and to perform photoelectric conversion. In addition, the blue photoelectric conversion portion 201B is configured so as to allow the greater amount of the light other than the blue component to be transmitted than the light of the blue component.

Although not illustrated, in the blue photoelectric conversion portion 201B, the pixels are configured so that the electric signal according to the generated signal charges is read out by the blue reading circuit portion (not shown). The blue reading circuit portion (not shown) is configured so that the reading circuit similar to the aforementioned reading circuit 20 is disposed at each pixel P to read out the signal charges generated by the blue photoelectric conversion portion 201B of each pixel P.

(A-3-3) Red Photoelectric Conversion Portion 201R

In the solid-state imaging device 1, as illustrated in FIG. 3, the red photoelectric conversion portion 201R is disposed in an inner portion of the substrate 101. Herein, the red photoelectric conversion portion 201R is formed to be disposed at the position deeper than the blue photoelectric conversion portion 201B.

A plurality of the red photoelectric conversion portions 201R are disposed so as to correspond to a plurality of the pixels P. In other words, the red photoelectric conversion portions 201R are disposed to be aligned in the horizontal direction x and the vertical direction y perpendicular to the horizontal direction x in the imaging area (xy plane).

Similarly to the blue photoelectric conversion portion 201B, the red photoelectric conversion portion 201R is a photodiode which has a pn junction in the internal portion of the substrate 101. The red photoelectric conversion portion 201R selectively absorbs the light of the red component in the incident light (subject image) and performs photoelectric conversion, so that signal charges are generated. In other words, the red photoelectric conversion portion 201R is configured to receive the light of the red wavelength range within the light transmitted by the blue photoelectric conversion portion 201B of the upper layer and to perform photoelectric conversion.

Although not illustrated, in the red photoelectric conversion portion 201R, the pixels are configured so that the electric signals according to the generated signal charges are read out by the red reading circuit portion (not shown). The red reading circuit portion (not shown) is configured so that the reading circuit similar to the aforementioned reading circuit 20 is disposed at each pixel P to read out the signal charges generated by the red photoelectric conversion portion 201R of each pixel P.

(A-3-4) Others

As other configurations, in the solid-state imaging device 1, on-chip lenses (not shown) are disposed so as to correspond to the pixels P. Herein, the on-chip lenses (not shown) are disposed on the upper surface of the green photoelectric conversion portion 201G with a passivation layer (not shown) interposed therebetween.

(B) Method of Manufacturing Solid-State Imaging Device

Main components of a method of manufacturing the aforementioned solid-state imaging device 1 will be described.

FIGS. 6 to 10 are diagrams illustrating a method of manufacturing a solid-state imaging device according to the first embodiment of the invention. FIGS. 6 to 10 illustrate cross sections similarly to FIG. 3.

Figure 6:
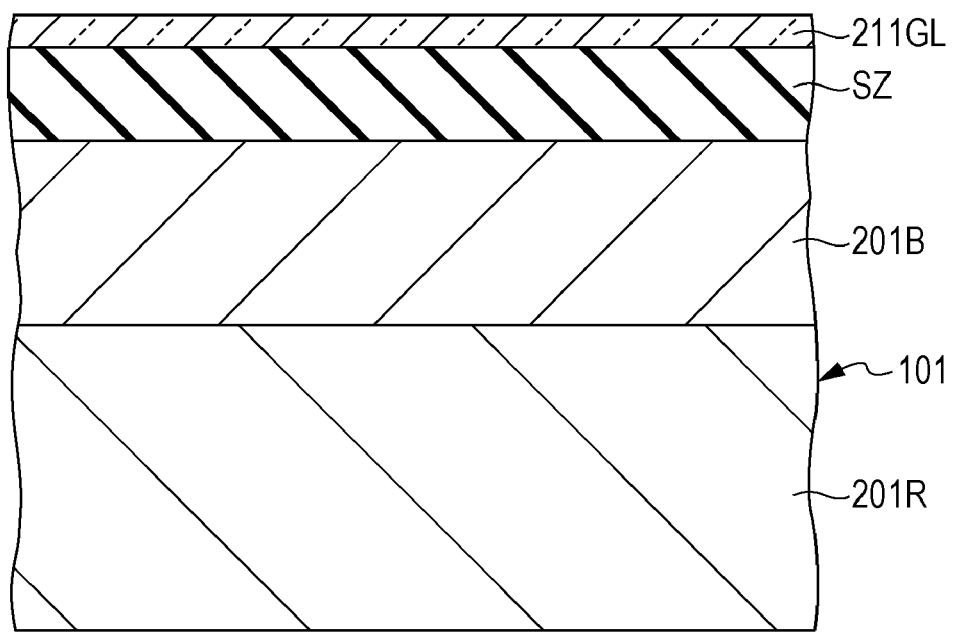
FIG. 6 is a diagram illustrating a method of manufacturing a solid-state imaging device according to the first embodiment of the invention.

First, as illustrated in FIG. 6, a red photoelectric conversion portion 201R and a blue photoelectric conversion portion 201B are formed, and a lower portion electrode 211GL of a green photoelectric conversion portion 201G is formed.

Herein, the red photoelectric conversion portion 201R and the blue photoelectric conversion portion 201B are formed in an inner portion of a substrate 101. The red photoelectric conversion portion 201R is formed so as to be located at a position deeper than the blue photoelectric conversion portion 201B.

More specifically, each of the red photoelectric conversion portion 201R and the blue photoelectric conversion portion 201B is formed by providing a photodiode by appropriately performing ion injection of impurities in the substrate 101 made of a silicon semiconductor.

For example, the blue photoelectric conversion portion 201B is formed at a position separated by 0.6 μm from the upper surface of the substrate 101. In addition, in addition, the red photoelectric conversion portion 201R is formed at a position separated by 4.3 μm from the lower surface of the blue photoelectric conversion portion 201B.

In addition, after semiconductor devices such as a reading circuit (not shown) is formed on the upper surface of the substrate 101, an insulating layer SZ is formed so as to cover the semiconductor devices. Herein, the insulating layer SZ may be disposed by laminating plural types of insulating materials. For example, after an HfO layer having a thickness of 60 nm is formed, the insulating layer SZ may be formed by laminating an $SiO_2$ layer.

In addition, a lower portion electrode 211GL of the green photoelectric conversion portion 201G is formed on the upper surface of the insulating layer SZ. For example, the lower portion electrode 211GL is formed by forming an ITO layer having a thickness of 100 nm according to a sputtering method.

Figure 7:
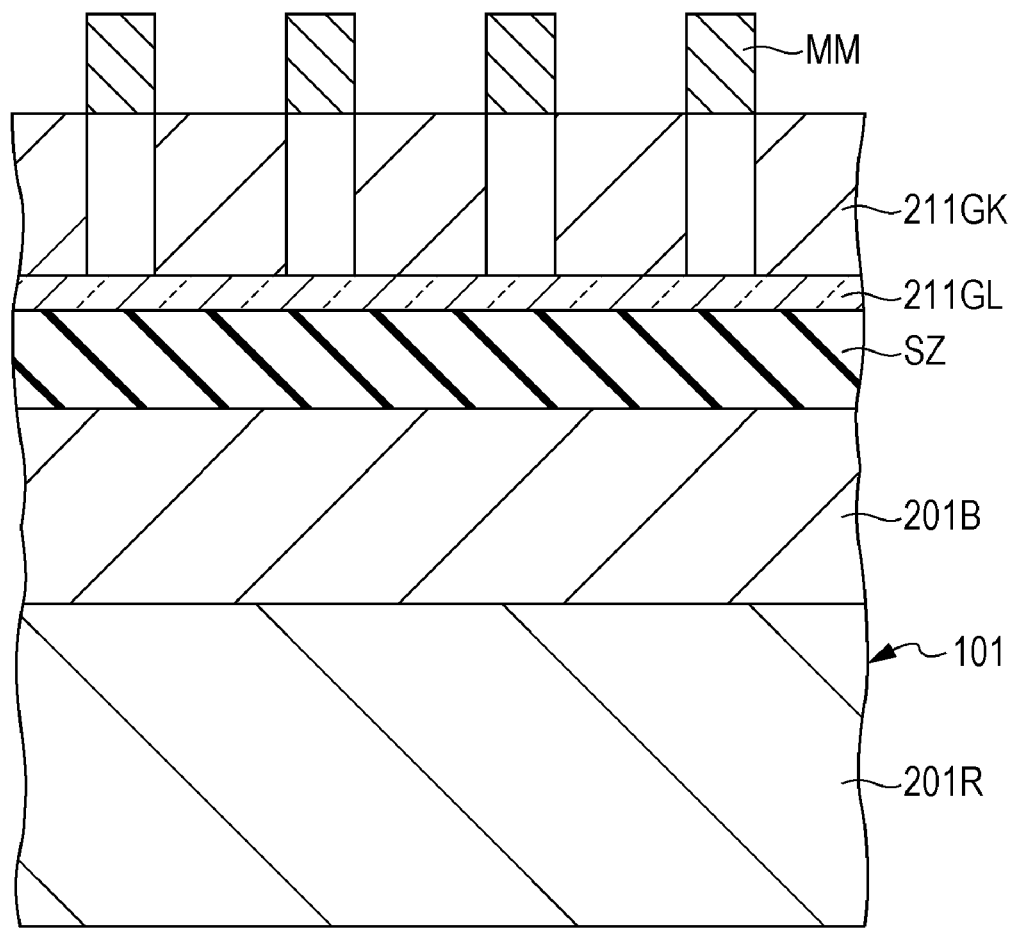
FIG. 7 is a diagram illustrating a method of manufacturing a solid-state imaging device according to the first embodiment of the invention.

In addition, as illustrated in FIG. 7, the organic photoelectric conversion layer 211GK of the green photoelectric conversion portion 201G is formed.

Herein, a metal mask MM is disposed above the insulating layer SZ. More specifically, the metal mask MM where the opening is installed is disposed so that the organic photoelectric conversion layer 211GK of the green photoelectric conversion portion 201G corresponds to a pattern.

In addition, the organic photoelectric conversion layer 211GK is formed by performing vacuum vapor deposition of an organic photoelectric conversion material on the upper surface of the insulating layer SZ through the metal mask MM. For example, the organic photoelectric conversion layer 211GK is formed by using an organic photoelectric conversion material including a polycyclic organic pigment such as a quinacridone series.

Figure 8:
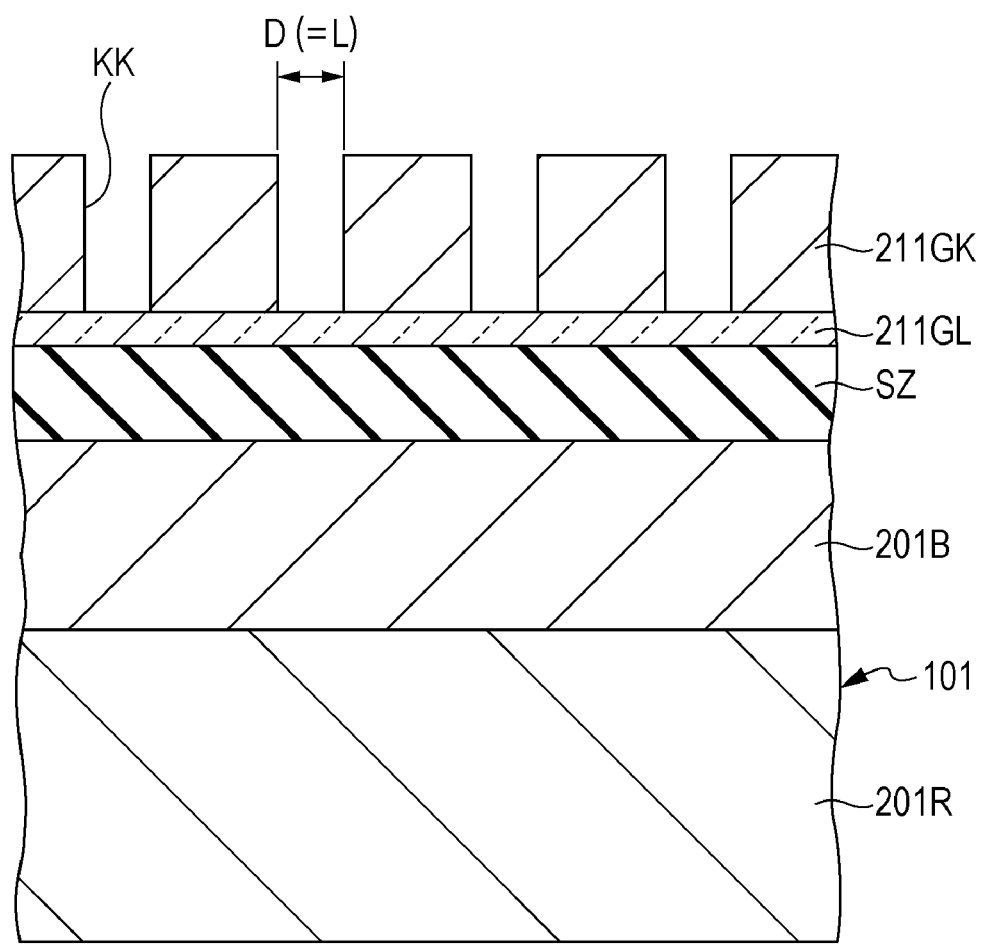
FIG. 8 is a diagram illustrating a method of manufacturing a solid-state imaging device according to the first embodiment of the invention.

Next, as illustrated in FIG. 8, the metal mask MM is removed. Accordingly, an organic photoelectric conversion layer 211GK in which an opening KK is disposed may be formed in a portion where the transmitting window TM is formed.

Next, as illustrated in FIG. 9, a silicon oxide layer TMm is disposed.

Herein, a silicon oxide layer TMm is formed, so that the internal portion of the opening KK disposed in the organic photoelectric conversion layer 211GK is buried.

Figure 10:
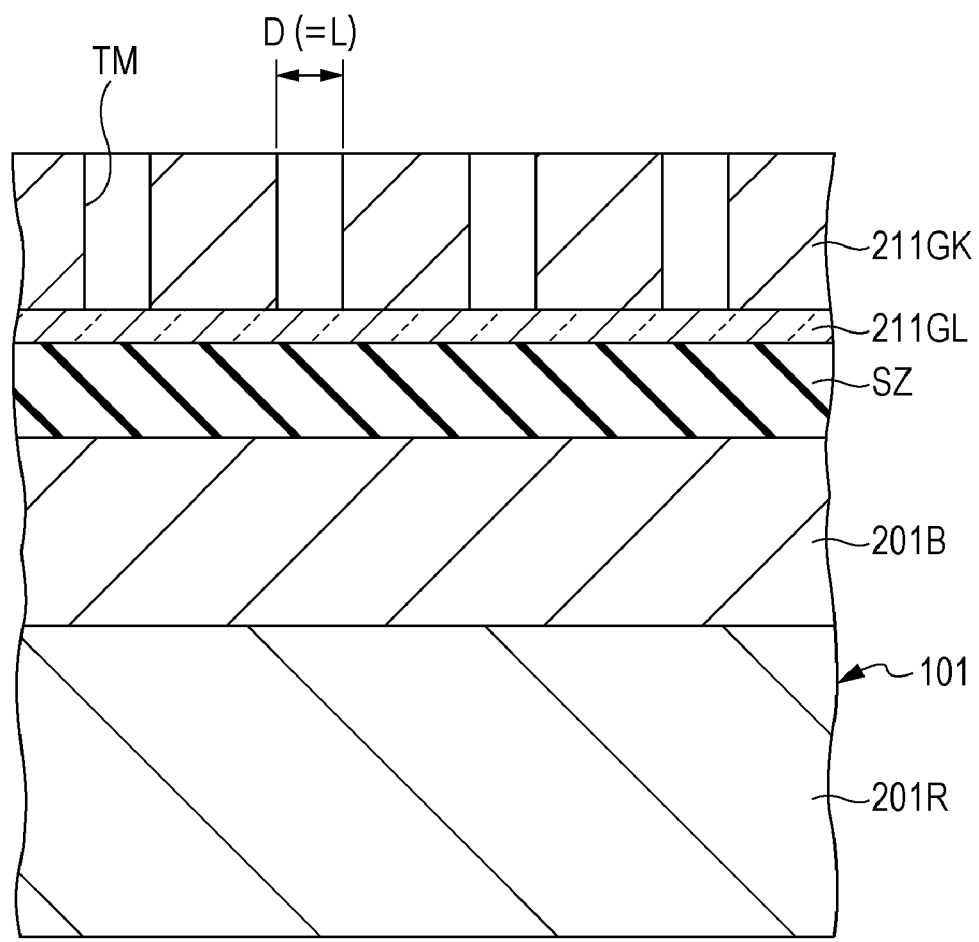
FIG. 10 is a diagram illustrating a method of manufacturing a solid-state imaging device according to the first embodiment of the invention.

Next, as illustrated in FIG. 10, transmitting windows TM are formed.

Herein, the transmitting windows TM are formed by removing the silicon oxide layer TMm on the upper surface portion of the organic photoelectric conversion layer 211GK. For example, the transmitting windows TM are formed by performing an etching process on the silicon oxide layer TMm according to an RIE method.

Next, as illustrated in FIG. 3, formation of the upper portion electrode 211GU of the green photoelectric conversion portion 201G is performed.

Herein, the upper portion electrode 211GU is formed on the upper surface of the organic photoelectric conversion layer 211GK. For example, the upper portion electrode 211GU is formed by forming an ITO layer having a thickness of 100 nm according to a sputtering method. Accordingly, the green photoelectric conversion portion 201G is completed.

Next, a passivation layer (not shown) is disposed on the upper surface of the green photoelectric conversion portion 201G. For example, an SiN layer having a thickness of 400 nm is disposed as the passivation layer (not shown).

In addition, on-chip lenses (not shown) are disposed on the passivation layer (not shown) so as to correspond to the pixels P. For example, the on-chip lenses (not shown) are disposed so as to have a lens thickness of 350 nm.

(C) Conclusions

As described above, in the embodiment, the green photoelectric conversion portion 201G which selectively receives the light of the green wavelength range in the incident light and performs photoelectric conversion and the blue photoelectric conversion portion 201B which selectively receives the light of the blue wavelength range of which the wavelength is shorter than that of the green wavelength range in the incident light and performs photoelectric conversion are included. In addition, the red photoelectric conversion portion 201R which selectively receives the light of the red wavelength range different from the green and blue wavelength ranges and performs photoelectric conversion is included.

Herein, the green photoelectric conversion portion 201G is laminated above the blue photoelectric conversion portion 201B in the imaging area (xy plane) of the substrate 101 so that the blue photoelectric conversion portion 201B receives the light transmitting the green photoelectric conversion portion 201G. In addition, the blue photoelectric conversion portion 201B and the green photoelectric conversion portion 201G are laminated above the red photoelectric conversion portion 201R so that the red photoelectric conversion portion 201R receives the light transmitting the blue photoelectric conversion portion 201B and the green photoelectric conversion portion 201G.

In addition, transmitting windows TM are disposed in the green photoelectric conversion portion 201G. The transmitting window TM is formed so that the greater amount of light of the blue wavelength range is allowed to be transmitted to the blue photoelectric conversion portion 201B more than the portions other than the transmitting window TM. The transmitting window TM is formed so that the width D defined in the direction of the imaging area (xy plane) of the substrate 101 satisfies the aforementioned Equation (1). Therefore, in the green photoelectric conversion portion 201G, the greater amount of the blue light is transmitted according to the "waveguide theory".

Therefore, the organic photoelectric conversion layer 211GK constituting the green photoelectric conversion portion 201G has low sensitivity in regards to the blue wavelength range which is outside of the green wavelength range. In addition, the absorbed amount of the blue light in the green photoelectric conversion portion 201G is decreased, and the absorbed amount of the blue light in the blue photoelectric conversion portion 201B is increased. As a result, in the "lamination type", it is possible to improve color reproducibility. In addition, as a result, it is possible to prevent occurrence of noise amplification by a calculation signal process, so that it is possible to improve image quality.

Figure 11:
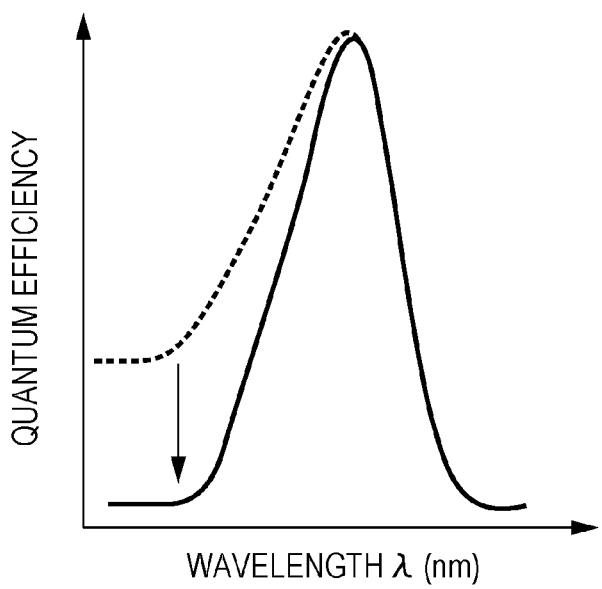
FIG. 11 is a diagram illustrating an external quantum efficiency of the organic photoelectric conversion layer according to the first embodiment of the invention.

FIG. 11 is a diagram illustrating an external quantum efficiency of the organic photoelectric conversion layer 211GK according to the first embodiment of the invention. In FIG. 11, the horizontal axis represents a wavelength (nm) of light, and the vertical axis represents the quantum efficiency.

Figure 12:
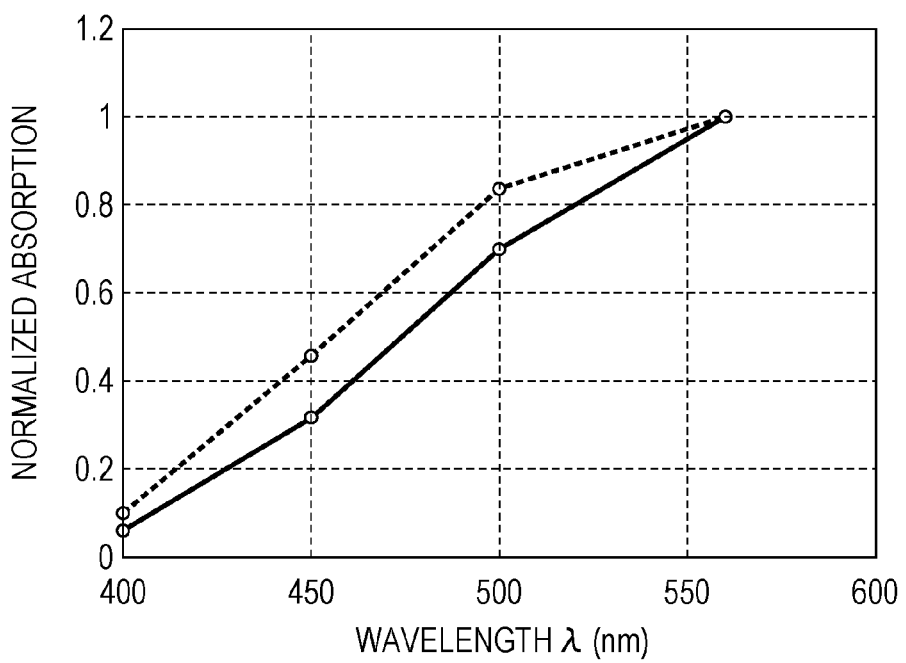
FIG. 12 is a diagram illustrating an absorption characteristic of the organic photoelectric conversion layer according to the first embodiment of the invention.

In addition, FIG. 12 is a diagram illustrating an absorption characteristic of the organic photoelectric conversion layer 211GK according to the first embodiment of the invention. In FIG. 12, the horizontal axis represents a wavelength (nm) of light, and the vertical axis represents the absorption. Herein, the result of simulation according to an FDTD method is illustrated in the case where the organic photoelectric conversion layer 211GK has a thickness of 300 nm and the transmitting windows TM having a width D of 100 nm are disposed in the period of 200 nm (FDTD method=Finite-difference time-domain method).

Figure 13:
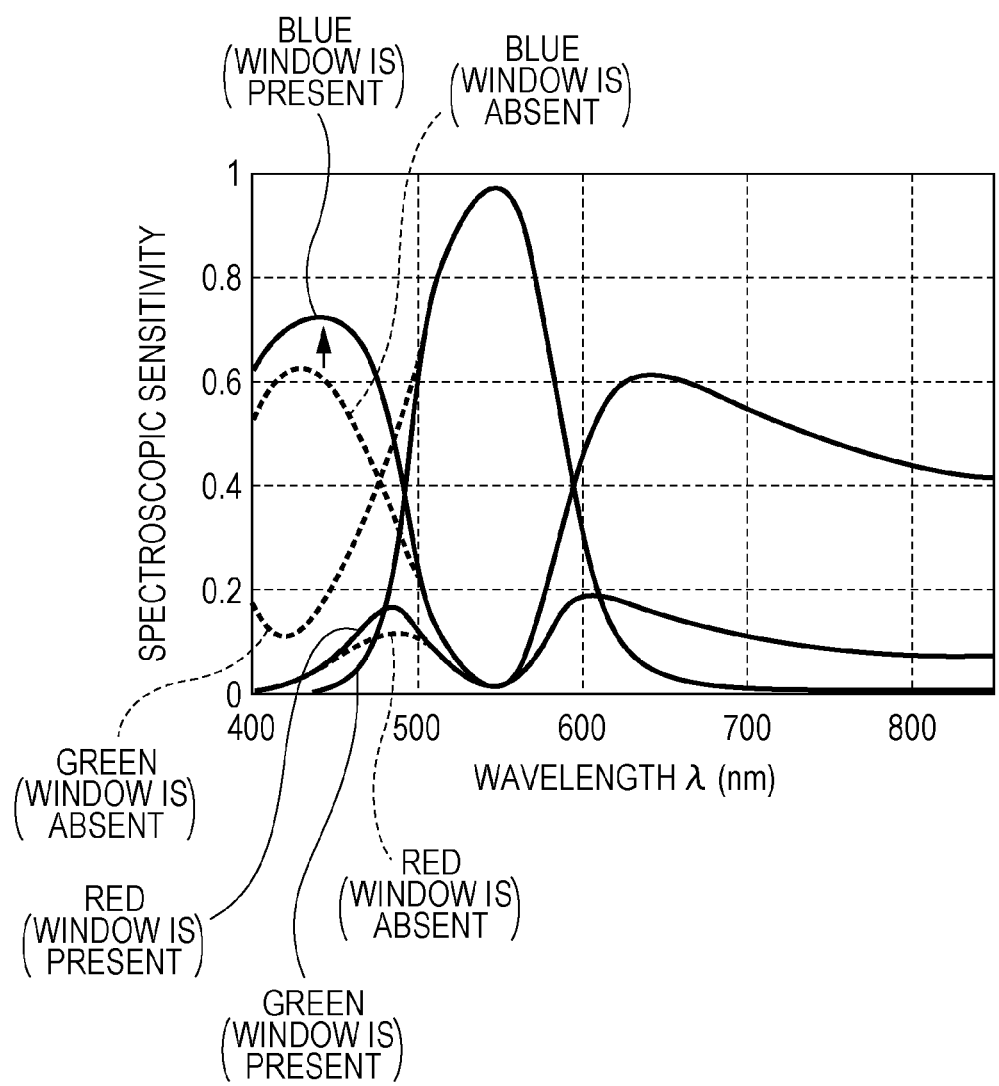
FIG. 13 is a diagram illustrating a spectroscopic sensitivity of a solid-state imaging device according to the first embodiment of the invention.

In addition, FIG. 13 is a diagram illustrating a spectroscopic sensitivity of the solid-state imaging device according to the first embodiment of the invention. In FIG. 13, the horizontal axis represents a wavelength (nm) of light, and the vertical axis represents the spectroscopic sensitivity.

In FIGS. 11, 12, and 13, solid lines indicate the cases of the embodiment, broken lines indicate the cases where the transmitting window TM is not provided to the organic photoelectric conversion layer 211GK according to the embodiment.

As illustrated in FIG. 11, in the case of the embodiment (solid line), with respect to the blue wavelength range, of which the wavelength is shorter than that of the green wavelength range, the external quantum efficiency is low in comparison with the case where the transmitting window TM is not provided (broken line). In addition, as illustrated in FIG. 12, with respect to the blue wavelength range, of which the wavelength is shorter than that of the green wavelength range, the absorbance is low.

Therefore, the absorbed amount of the blue light is decreased in the photoelectric conversion portion receiving the green light, so that the incident amount of the blue light is increased in the photoelectric conversion portion receiving the blue light disposed at the lower layer thereof.

Therefore, as illustrated in FIG. 13, with respect to the blue wavelength range, the sensitivity of the blue photoelectric conversion portion 201B is increased, and the sensitivity of the green photoelectric conversion portion 201G is decreased. Accordingly, the color balance is improved, and the occurrence of noise is suppressed, so that it is possible to improve image quality.

In addition, the transmitting window TM is formed as an opening which penetrates from the upper surface to the lower surface of the photoelectric conversion layer 211GK constituting the green photoelectric conversion portion 201G. In addition, the transmitting window TM is formed with a pattern surrounded by the organic photoelectric conversion layer 211GK constituting the green photoelectric conversion portion 201G in the imaging area (xy plane) of the substrate 101. Therefore, the light incident from the upper portion transmits the lower portion in the internal portion of the transmitting window TM where it is more difficult to absorb the light than the photoelectric conversion layer 211GK, so that it is possible to obtain a very good effect.

2. Second Embodiment (A) Configuration of Device and Others

Figure 14:
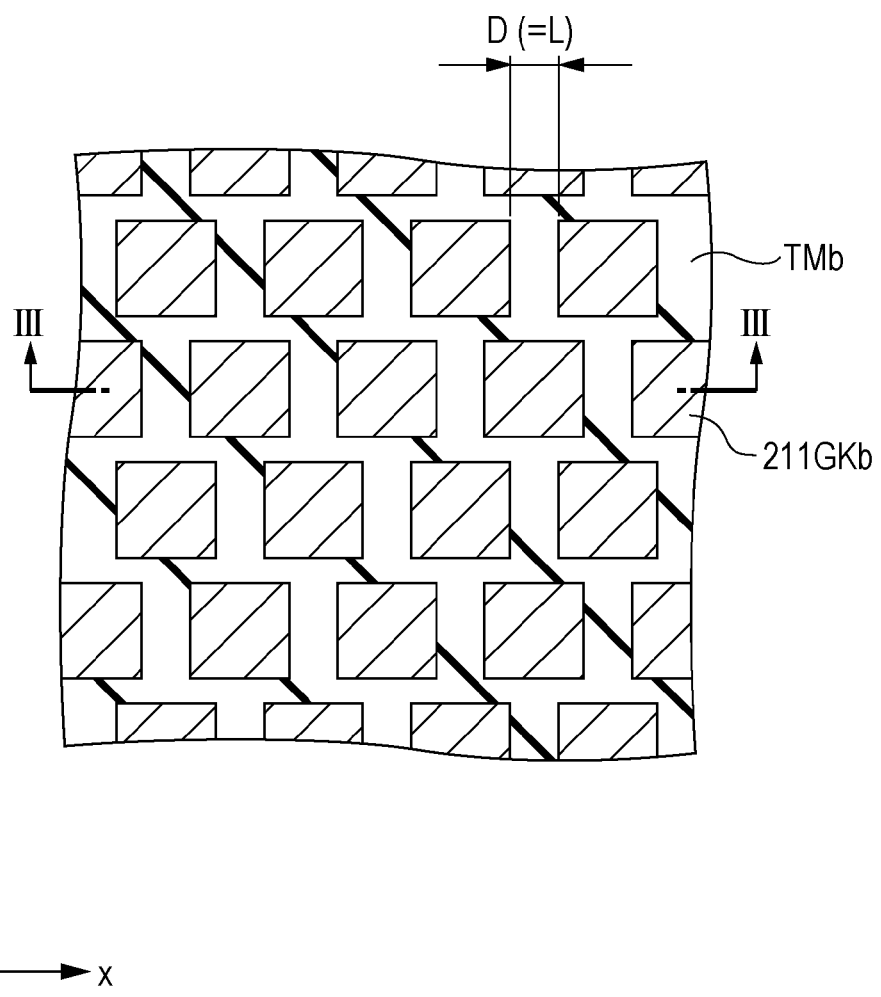
FIG. 14 is a diagram illustrating main components of a solid-state imaging device according to a second embodiment of the invention.

FIG. 14 is a diagram illustrating main components of a solid-state imaging device according to a second embodiment of the invention.

Herein, FIG. 14 is a diagram illustrating an organic photoelectric conversion layer 211GKb similarly to FIG. 4. Similarly to FIG. 4, FIG. 14 illustrates an upper surface of the organic photoelectric conversion layer 211GKb, and the III-III portion corresponds to FIG. 3.

As illustrated in FIG. 14, in the embodiment, the shape of the transmitting window TMb disposed in the organic photoelectric conversion layer 211GKb is different from that of the case of the first embodiment. The embodiment is the same as the first embodiment except for this point. Therefore, the description of the redundant portions is omitted.

As illustrated in FIG. 14, similarly to the first embodiment, in the organic photoelectric conversion layer 211GKb according to the embodiment, the transmitting window TMb is disposed in the plane direction (xy plane) of the substrate 101.

However, as illustrated in FIG. 14, unlike the first embodiment, the transmitting window TMb is disposed to surround the portion where the organic photoelectric conversion layer 211GKb is formed in the plane direction (xy plane) of the substrate 101. Herein, the transmitting windows TMb are disposed so that the square-shaped organic photoelectric conversion layers 211GKb are aligned in the plane direction (xy plane) of the substrate 101 so as to be integrally connected to the peripheral portions.

More specifically, a plurality of the square-shaped organic photoelectric conversion layers 211GKb is disposed to be aligned at an equal interval in the x direction. In addition, a plurality of the organic photoelectric conversion layers 211GKb is also disposed to be aligned in the equal interval in the y direction. In the embodiment, the first group of a plurality of the organic photoelectric conversion layers 211GKb aligned in the x direction and the second group of a plurality of the organic photoelectric conversion layers 211GKb which are shifted by a half pitch in the x direction with respect to the organic photoelectric conversion layers 211GKb of the first group are included. In addition, the organic photoelectric conversion layers 211GKb are disposed so that the first group and the second group are alternately aligned in the y direction with the transmitting windows TMb interposed.

Similarly to the first embodiment, with respect to the transmitting window TMb, an opening is disposed in the organic photoelectric conversion layer 211GKb, and for example, an insulting material is buried inside the opening.

In addition, similarly to the first embodiment, the transmitting window TMb is formed so that the greater amount of the light of the wavelength range, which is selectively received and photoelectrically converted by the blue photoelectric conversion portion 201B in the lower layer of the green photoelectric conversion portion 201G, is allowed to be transmitted more than the portions other than the transmitting window TMb of the organic photoelectric conversion layer 211GKb. In other words, according to the "waveguide theory", each of the transmitting windows TM are formed to include the portion where the width D defined in the plane direction of the substrate 101 satisfies the aforementioned Equation (1).

(B) Conclusions

As described above, similarly to the first embodiment, in the embodiment, the transmitting windows TMb are disposed in the green photoelectric conversion portion 201Gb. The transmitting window TMb is formed so that the greater amount of the light of the blue wavelength range is allowed to be transmitted more to the blue photoelectric conversion portion 201B than the portions of the organic photoelectric conversion layer 211GKb other than the transmitting window TMb. More specifically, the transmitting window TMb is formed so that the width D defined in the direction of the imaging area (xy plane) of the substrate 101 satisfies the aforementioned Equation (1). Therefore, in the green photoelectric conversion portion 201Gb, the greater amount of the blue light is transmitted according to the "waveguide theory".

Therefore, the organic photoelectric conversion layer 211GKb constituting the green photoelectric conversion portion 201Gb has low sensitivity about the blue wavelength range except for the green wavelength range. In addition, the absorbed amount of the blue light in the green photoelectric conversion portion 201Gb is decreased, and the absorbed amount of the blue light in the blue photoelectric conversion portion 201B is increased. As a result, in the "lamination type", it is possible to improve color reproducibility. In addition, as a result, it is possible to prevent occurrence of noise amplification by a calculation signal process, so that it is possible to improve image quality.

Particularly, the transmitting windows TMb according to the embodiment are formed as a pattern surrounding the organic photoelectric conversion layers 211GKb in the imaging area (xy plane) of the substrate 101 (refer to FIG. 14). In this manner, if the transmitting window is formed in a quadrangle shape such as a square or a rectangle, the area of the opening is increased, the transmittance of the short wavelength range is further increased. Therefore, it is possible to further improve the image quality.

3. Third Embodiment (A) Configuration of Device and Others

Figure 15:
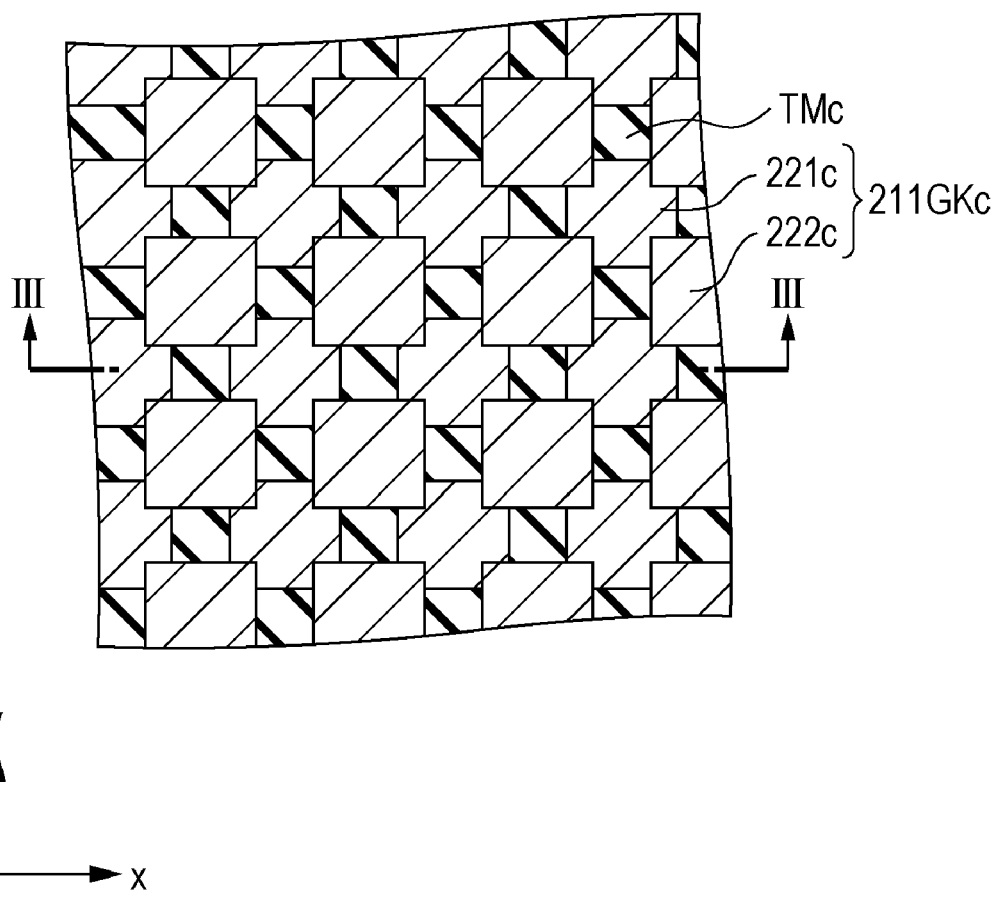
FIG. 15 is a diagram illustrating main components of a solid-state imaging device according to a third embodiment of the invention.

FIG. 15 is a diagram illustrating main components of a solid-state imaging device according to a third embodiment of the invention.

Herein, FIG. 15 is a diagram illustrating an organic photoelectric conversion layer 211GKc similarly to FIG. 4. Similarly to FIG. 4, FIG. 15 illustrates an upper surface of the organic photoelectric conversion layer 211GKc, and the III-III portion corresponds to FIG. 3.

As illustrated in FIG. 14, in the embodiment, shapes of the organic photoelectric conversion layer 211GKc and the transmitting window TMc are different from those of the case of the first embodiment. The embodiment is the same as the first embodiment except for this point. Therefore, the description of the redundant portions is omitted.

As illustrated in FIG. 15, similarly to the first embodiment, in the organic photoelectric conversion layer 211GKc according to the embodiment, the transmitting windows TMc are disposed in the plane direction (xy plane) of the substrate 101.

However, as illustrated in FIG. 14, unlike the first embodiment, the transmitting window TMc is formed in a quadrangle shape in the plane direction (xy plane) of the substrate 101. Herein, a plurality of the transmitting windows TMc are disposed to be aligned in the x direction and the y direction in the plane direction (xy plane) of the substrate 101.

More specifically, the organic photoelectric conversion layers 211GKc include a first group 221c and a second group 222c where a plurality of the organic photoelectric conversion layers 211GKc is aligned in the equal interval in the x direction and the y direction. Next, the first group 221c and the second group 222c are disposed so as to be shifted from each other by half pitch in the x direction and the y direction.

Similarly to the first embodiment, the aforementioned transmitting window TMc is formed so that the opening is disposed in the organic photoelectric conversion layer 211GKc and, for example, an insulating material is buried inside the opening.

In addition, similarly to the first embodiment, the transmitting window TMc is formed so that the greater amount of the light of the wavelength range, which is selectively received and photoelectrically converted by the blue photoelectric conversion portion 201B in the lower layer of the green photoelectric conversion portion 201G, is allowed to transmit more than the portions other than the transmitting window TMc of the organic photoelectric conversion layer 211GKc. In other words, according to the "waveguide theory", each of the transmitting windows TM is formed so as to include the portions where that the width D defined in the plane direction of the substrate 101 satisfies the following Equation (1).

(B) Method of Manufacturing Solid-State Imaging Device

The main components of the method of manufacturing the aforementioned solid-state imaging device 1 will be described.

Figure 16A:
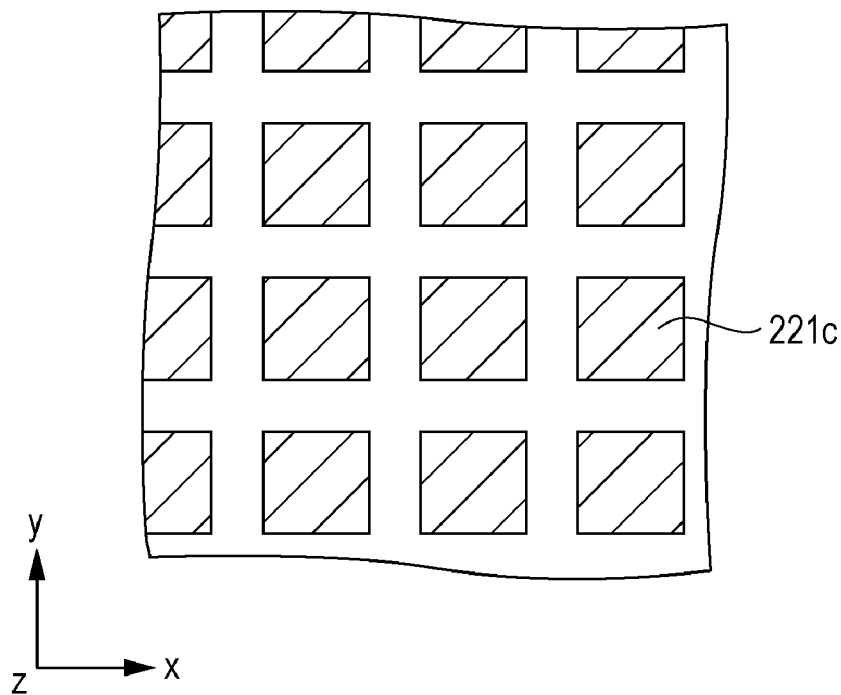
FIGS. 16A and 16B are diagrams illustrating a method of manufacturing a solid-state imaging device according to the second embodiment of the invention.
Figure 16B:
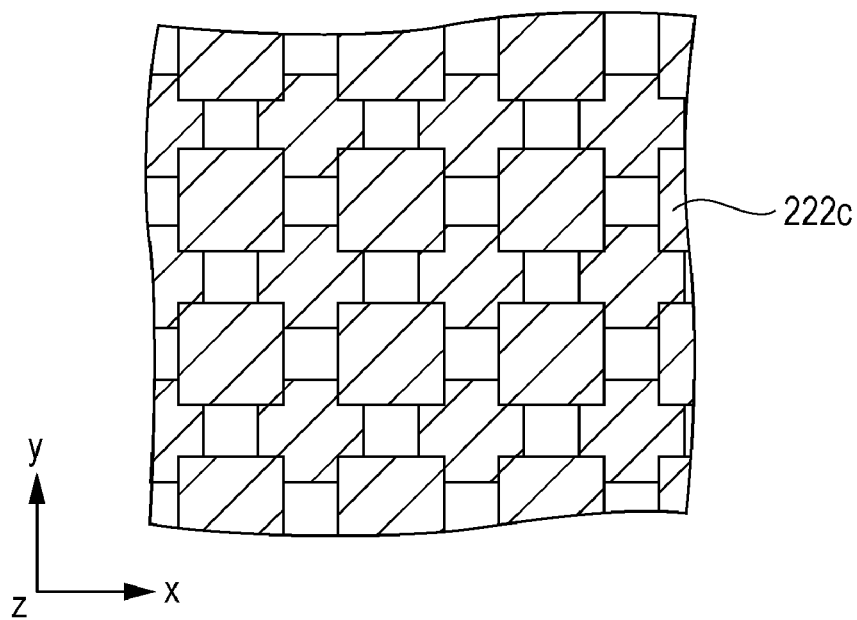

FIGS. 16A and 16B are diagrams illustrating a method of manufacturing the solid-state imaging device according to the third embodiment of the invention. FIGS. 16A and 16B illustrate the upper surface similarly to FIG. 15.

In the formation of the organic photoelectric conversion layer 211GKc, first, as illustrated in FIG. 16A, a first group 221c is formed.

Herein, as illustrated in FIG. 16A, the organic photoelectric conversion layers of the first group 221c is formed so that a plurality of square-shaped organic photoelectric conversion layers are aligned in the equal interval in the x direction and the y direction.

More specifically, similarly the first embodiment, the organic photoelectric conversion layer is formed by performing a vapor deposition of an organic photoelectric conversion material by using a metal mask (not shown) where the openings are formed in a lattice shape.

Next, as illustrated in FIG. 16B, a second group 222c is formed.

Herein, as illustrated in FIG. 16B, the organic photoelectric conversion layers of the second group 222c is formed so that a plurality of square-shaped organic photoelectric conversion layers are aligned in the equal interval in the x direction and the y direction. The second group 222c is formed so that a plurality of the square-shaped organic photoelectric conversion layers is shifted by a half pitch in the x direction and the y direction with respect to the first group 221c.

More specifically, as described above, the organic photoelectric conversion layer is formed by performing a vapor deposition of an organic photoelectric conversion material by using a metal mask (not shown) where the openings are formed in a lattice shape.

Next, the components are provided similarly to the first embodiment, so that the solid-state imaging device is completed.

(C) Conclusions

As described above, in the embodiment, similarly to the first embodiment, the transmitting window TMc is disposed in the green photoelectric conversion portion 201Gc. The transmitting window TMc is formed so that the greater amount of light of the blue wavelength range is allowed to be transmitted to the blue photoelectric conversion portion 201B than the organic photoelectric conversion layer 211GKc. More specifically, the transmitting window TMc is formed so that the width D defined in the direction of the imaging area (xy plane) of the substrate 101 satisfies the aforementioned Equation (1). Therefore, in the green photoelectric conversion portion 201Gc, the greater amount of the blue light is transmitted according to the "waveguide theory".

Therefore, the organic photoelectric conversion layer 211GKc constituting the green photoelectric conversion portion 201Gc has low sensitivity in regards to the blue wavelength range which is outside of the green wavelength range. In addition, the absorbed amount of the blue light in the green photoelectric conversion portion 201Gc is decreased, and the absorbed amount of the blue light in the blue photoelectric conversion portion 201B is increased. As a result, in the "lamination type", it is possible to improve color reproducibility. In addition, as a result, it is possible to prevent occurrence of noise amplification by a calculation signal process, so that it is possible to improve image quality.

4. Others

The present invention is not limited to the aforementioned embodiments, and various modified examples may be employed.

Modified Example 1

In the above description, although the case where the photoelectric conversion portion of the uppermost layer is formed by using an organic photoelectric conversion layer, is described, the invention is not limited thereto.

Figure 17:
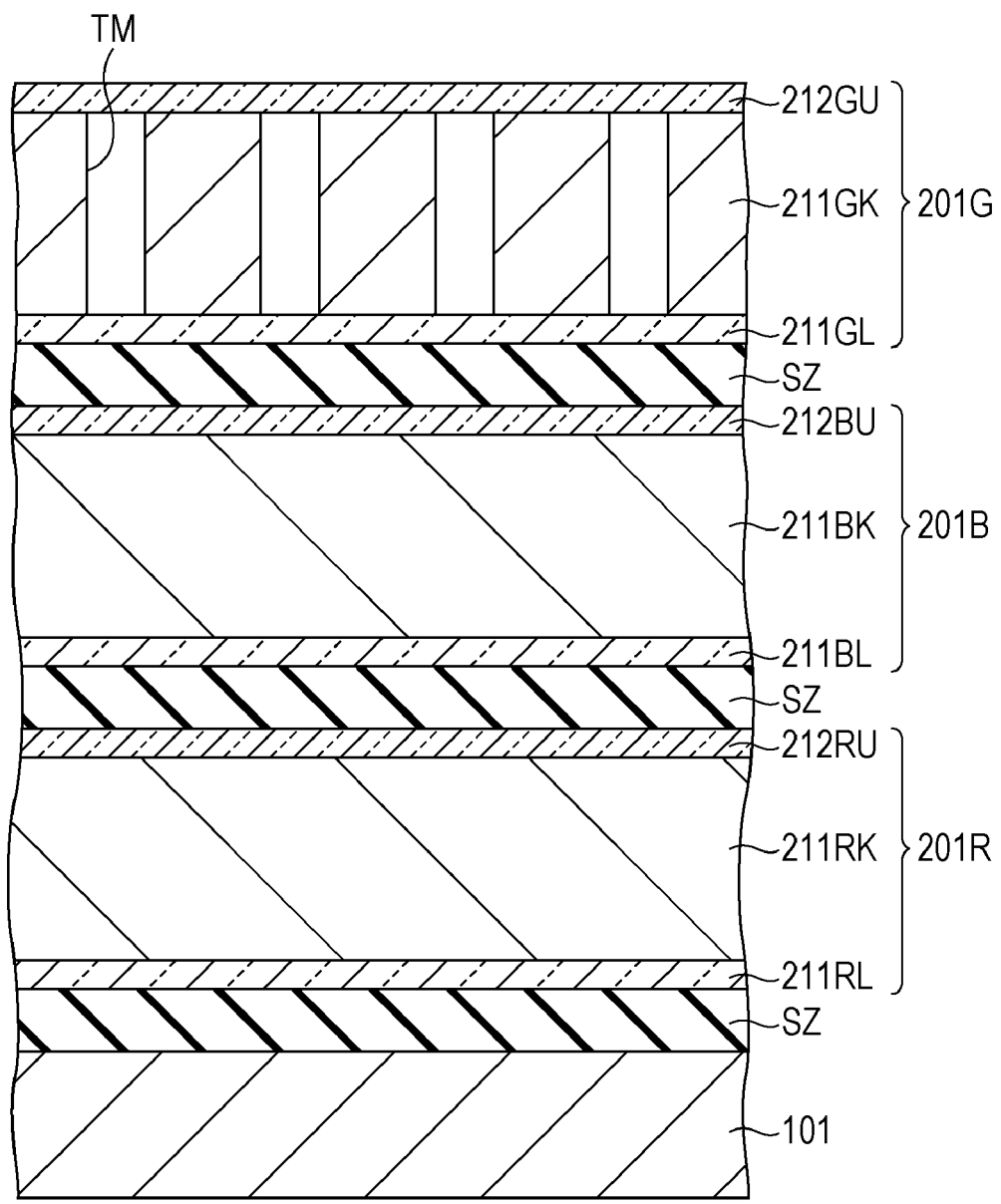
FIG. 17 is a diagram illustrating a modified example of the embodiment of the invention.

FIG. 17 is a diagram illustrating a modified example of the embodiment of the invention. FIG. 17 illustrates a cross section similarly to FIG. 3.

As illustrated in FIGS. 16A and 16B, besides the green photoelectric conversion portion 201G, the blue photoelectric conversion portion 201Bd and the red photoelectric conversion portion 201Rd may also be formed by using an organic photoelectric conversion layer.

More specifically, the blue photoelectric conversion portion 201Bd may be formed to include an organic photoelectric conversion layer 211BK, an upper portion electrode 211BU, and a lower portion electrode 211BL. In addition, the red photoelectric conversion portion 201Rd may be formed to include an organic photoelectric conversion layer 211RK, an upper portion electrode 211RU, and a lower portion electrode 211RL. Herein, the green photoelectric conversion portion 201G, the blue photoelectric conversion portion 201Bd, and the red photoelectric conversion portion 201Rd are formed so that the insulating layers SZ are interposed therebetween.

Modified Example 2

In the above description, although the case the transmitting window is formed so as to penetrate the organic photoelectric conversion layer is described, the invention is not limited thereto.

Figure 18:
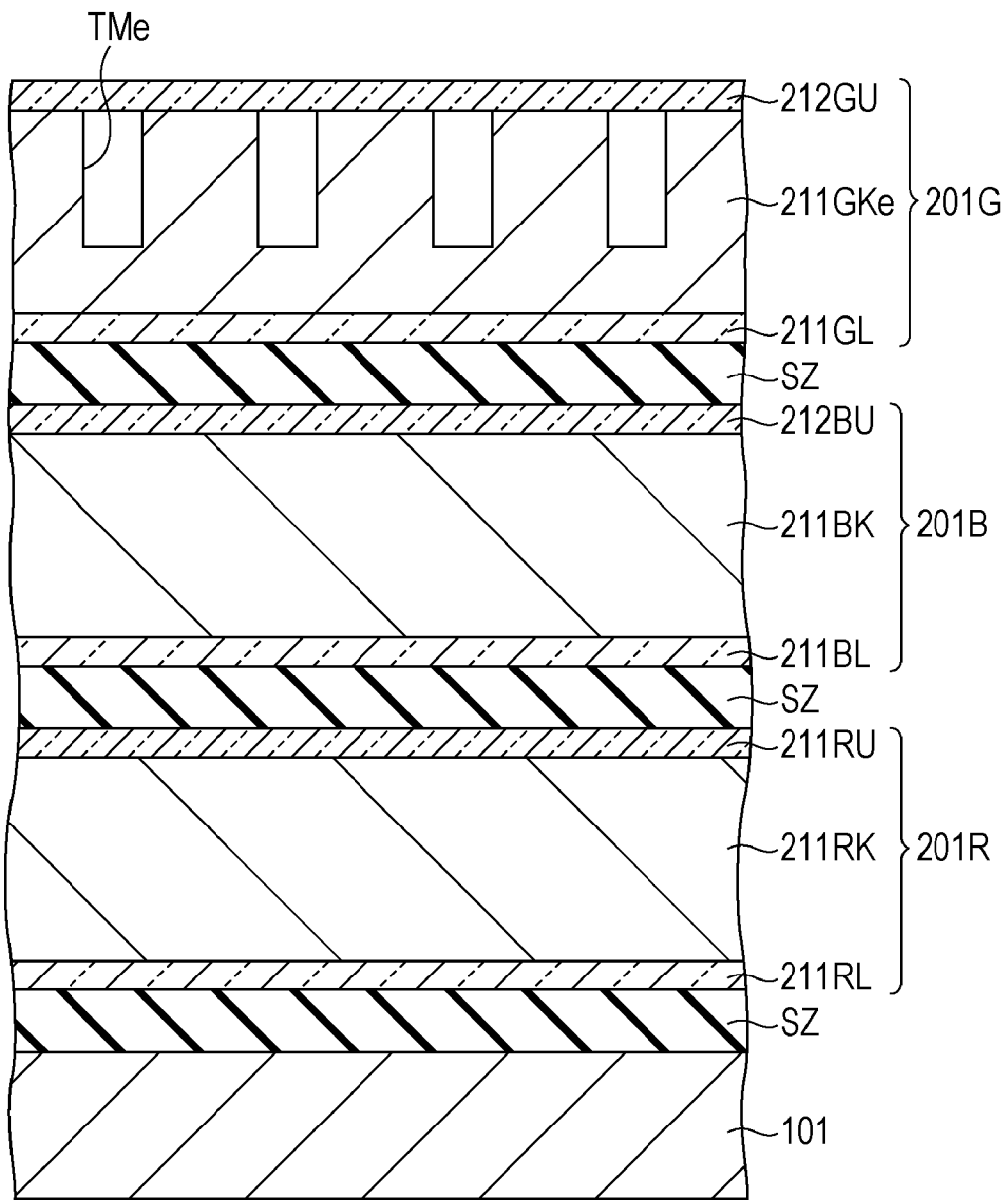
FIG. 18 is a diagram illustrating a modified example of the embodiment of the invention.

FIG. 18 is a diagram illustrating a modified example of the embodiment of the invention. FIG. 18 illustrates a cross section similarly to FIGS. 16A and 16B.

As illustrated in FIG. 18, the transmitting window TMe may be formed not to penetrate the organic photoelectric conversion layer 211GKe but to provide grooves in the upper surface. In other words, the transmitting window TMe may be formed to be recessed in a concave shape in the upper surface of the organic photoelectric conversion layer 211GKe.

As illustrated in FIG. 18, in the case where the transmitting window TMe is provided by forming the groove, the transmittance of the light of the short wavelength range is increased at least in a range down to a bottom of the groove according to the "principle of the waveguide". In addition, in the lower side of the bottom of the groove, the light is absorbed and transmitted in the organic photoelectric conversion layer 211GKe. Therefore, it is possible to arbitrarily control the transmittance of the short wavelength range by adjusting the depth of the groove.

In addition, in the modified example, although the case where the grooves are formed in the upper portion of the organic photoelectric conversion layer 211GKe is exemplified, the same function and effect may be obtained in the case where the grooves are formed in the lower portion of the organic photoelectric conversion layer 211GKe.

Modified Example 3

The shape of the transmitting window is not limited to the aforementioned example.

Figure 19:
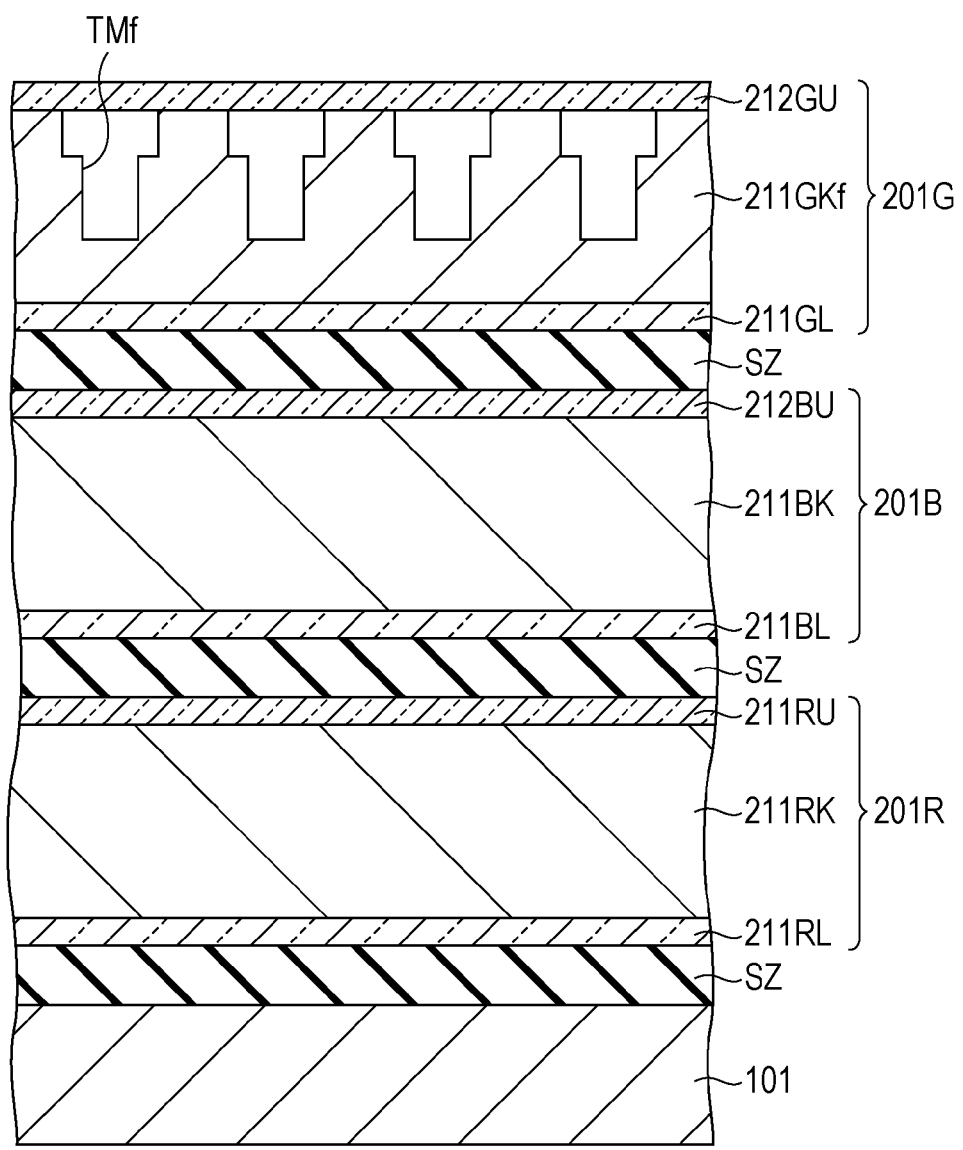
FIG. 19 is a diagram illustrating a modified example of the embodiment of the invention.

FIG. 19 is a diagram illustrating a modified example of the embodiment of the invention. FIG. 19 illustrates a cross section similarly to FIGS. 16A and 16B.

As illustrated in FIG. 19, in the upper surface of the organic photoelectric conversion layer 211GKf, concave portions which are recessed in a concave shape may be included, and the transmitting windows TMf may be formed so as to penetrate the central portions of the concave portions.

In this manner, in the structure where the width of the groove is changed in the depth direction, the selected wavelength is changed according to the "waveguide theory". Therefore, it is possible to control transmission spectrum by using the shape of the groove.

In addition, in the modified example, although the case where the groove is formed so that the upper side portion is wide and the lower side portion is narrow is exemplified, the same function and effect may be obtained in the case where the upper side portion is narrow and the lower side portion is wide.

Modified Example 4

In the above description, although the case where the signal charges generated by the green photoelectric conversion portion 201G are stored in the storage diode and the signal charges are transmitted from the storage diode to the transfer transistor is described, the invention is not limited thereto.

Figure 20A:
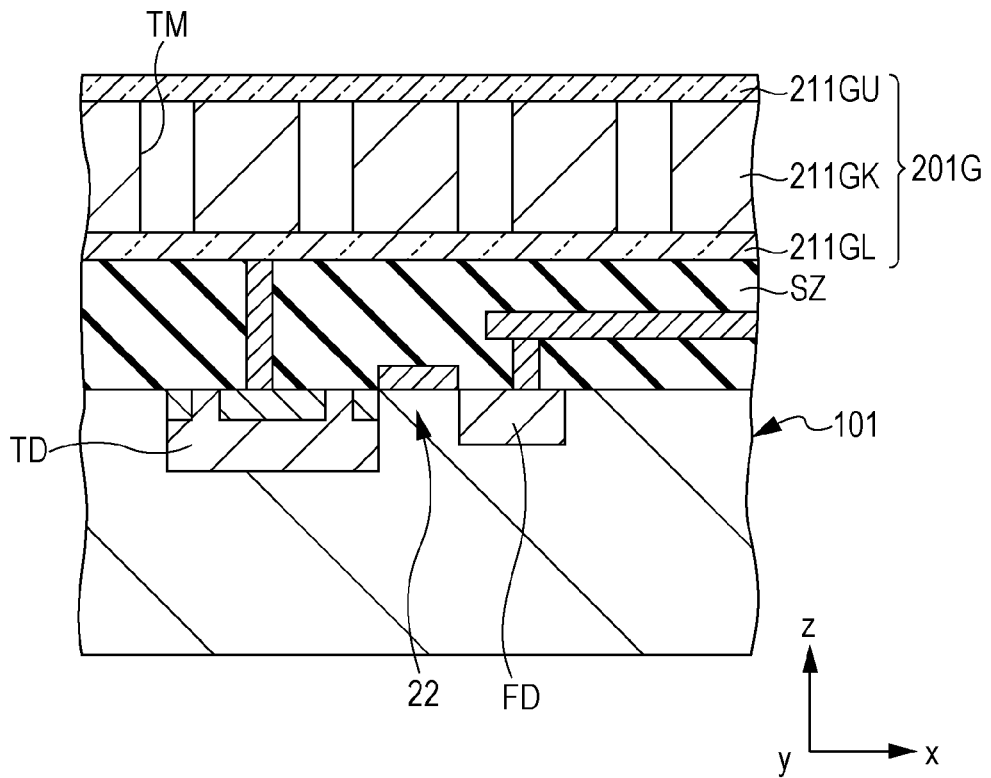
FIGS. 20A and 20B are diagrams illustrating a modified example of the embodiment of the invention.
Figure 20B:
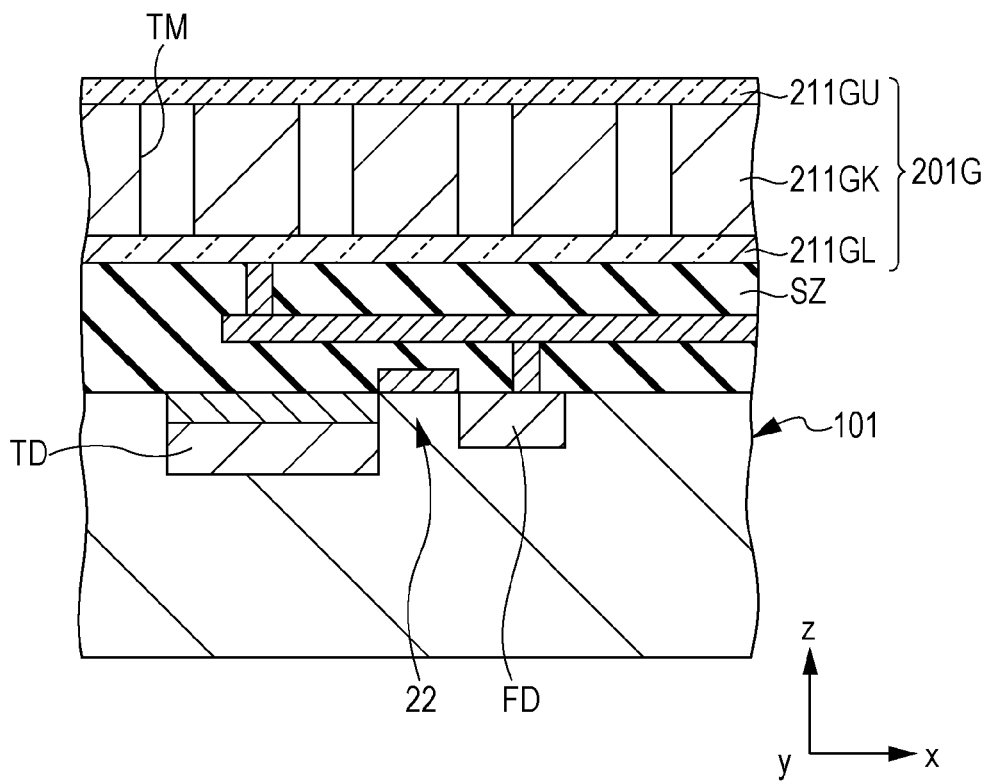
Figure 21:
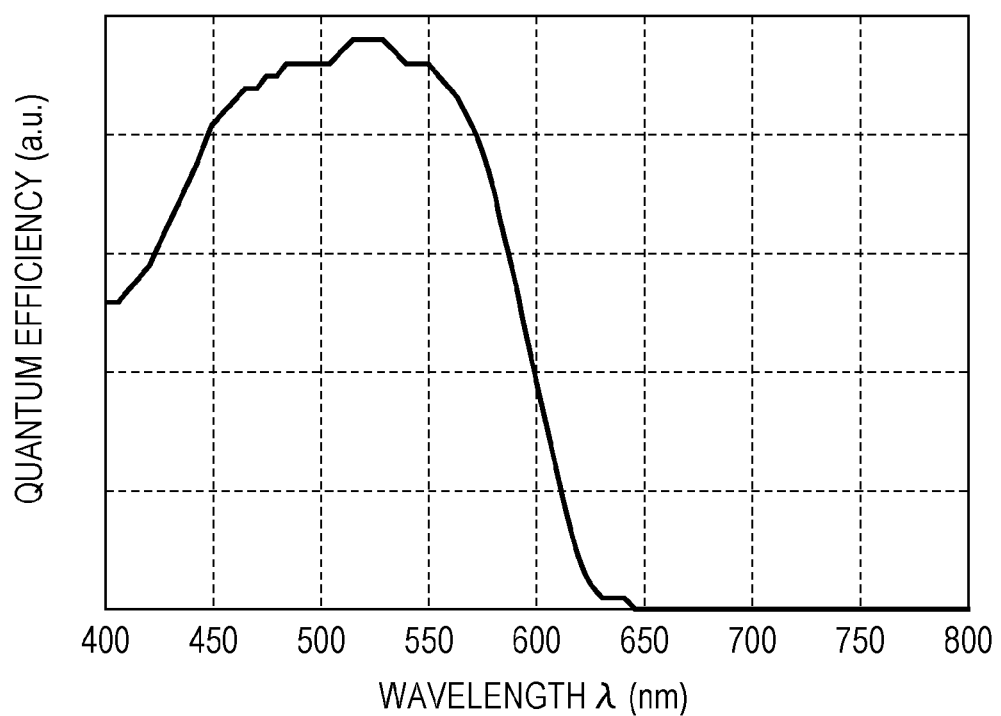
FIG. 21 is a diagram illustrating a measurement result of an external quantum efficiency of an organic photoelectric conversion layer formed by using quinacridone.

FIGS. 20A and 20B are diagrams illustrating a modified example of the embodiment of the invention. FIGS. 20A and 20B illustrate cross sections similarly to FIGS. 16A and 16B.

As illustrated in FIG. 20A, in the aforementioned embodiments, the lower portion electrode 211GL of the green photoelectric conversion portion 201G is electrically connected through a plug PL to a storage diode TD, so that the signal charges are stored in the storage diode TD.

Alternatively, as illustrated in FIG. 20B, the lower portion electrode 211GL of the green photoelectric conversion portion 201G may be electrically connected through the plug PL to the floating diffusion FD.

(Others)

In the above description, although the case where the transmitting window is formed in the organic photoelectric conversion layer is described, the invention is not limited thereto.

In the case where the photoelectric conversion layer is formed by using an inorganic material, if the transmitting window is formed in the photoelectric conversion layer of the inorganic material, it is possible to obtain the same function and effect. For example, in the case where the photoelectric conversion layer is formed by using the following inorganic material, it is possible to obtain the same function and effect. The inorganic material includes a chalcopyrite material such as $CuGaInS_2$ or $CuGaInSe_2$, a III-V group compound semiconductor material such as InP or GaAs, a II-VI group compound semiconductor material such as ZnSe, and a IV group compound semiconductor material such as Si or Ge.

In addition, in the above description, although the case where the transmitting window is formed in the photoelectric conversion layer by forming a layer with a photoelectric conversion material in the portion except for the transmitting window formation area, is described, the invention is not limited thereto. For example, after a layer is formed in an area including the transmitting window formation area by using a photoelectric conversion material, the layer formed in the transmitting window formation area is etched by using a lithography technique, so that the transmitting window may be formed in the photoelectric conversion layer.

In addition, in the above description, although the case where the $SiO_2$ is buried in the transmitting window, the invention is not limited thereto. An SiN, an SiON, or an SiC may be buried. Alternatively, a solid material is not buried, but it may be configured with an air layer.

In addition, in the aforementioned embodiments, although the case where the invention is applied to a camera is described, the invention is not limited thereto. The invention may be applied to other electronic apparatuses such as a scanner or a copier including a solid-state imaging device.

In addition, in the aforementioned embodiments, the solid-state imaging device 1 corresponds to a solid-state imaging device according to the invention. In addition, in the aforementioned embodiments, each of the green photoelectric conversion portions 201G, 201Gb, and 201Gc corresponds to a first photoelectric conversion portion according to the invention. In addition, in the aforementioned embodiments, each of the blue photoelectric conversion portions 201B and 201Bd corresponds to a second photoelectric conversion portion according to the invention. In addition, in the aforementioned embodiments, each of the red photoelectric conversion portions 201R and 201Rd corresponds to a third photoelectric conversion portion according to the invention. In addition, in the aforementioned embodiments, each of the transmitting windows TM, TMb, TMc, TMe, and TMf corresponds to a transmitting portion according to the invention.

The present application contains subject matter related to that disclosed in Japanese Priority Patent Application JP 2010-021219 filed in the Japan Patent Office on Feb. 2, 2010, the entire contents of which are hereby incorporated by reference.

It should be understood by those skilled in the art that various modifications, combinations, sub-combinations, and alterations may occur depending on design requirements and other factors insofar as they are within the scope of the appended claims or the equivalents thereof.

What is claimed is:

1. A solid-state imaging device comprising:
a first photoelectric conversion portion which selectively receives incident light of a first wavelength range and performs photoelectric conversion thereof; and
a second photoelectric conversion portion which selectively receives incident light of a second wavelength range which is shorter than the first wavelength range and performs photoelectric conversion thereof, wherein,
the first photoelectric conversion portion is stacked above the second photoelectric conversion portion in an imaging area of a substrate so that the second photoelectric conversion portion receives the incident light of the second wavelength range as light transmitted via the first photoelectric conversion portion,
the first photoelectric conversion portion includes a transmitting portion so that the light of the second wavelength range is transmitted to the second photoelectric conversion portion more than other portions,
the transmitting portion includes a portion satisfying an Equation (1) within a width D which is defined in a direction of the imaging area of the substrate, a refraction index n of a peripheral portion of the transmitting portion, and a longest wavelength $\lambda c$ of the second wavelength range which is selectively photoelectrically converted in the second photoelectric conversion portion; and
Equation (1) is the relationship $\lambda c/n \leqq 2D$.

2. The solid-state imaging device according to claim 1, wherein:
the transmitting portion an Equation (2) within a maximum width L which is defined in the direction of the imaging area of the substrate, the refraction index n of the peripheral portion of the transmitting portion, and the longest wavelength $\lambda c$ of the second wavelength range which is selectively photoelectrically converted in the second photoelectric conversion portion; and
Equation (2) is the relationship $\lambda c/n \leqq 2L$.

3. The solid-state imaging device according to claim 2, wherein the transmitting portion penetrates between an upper surface and a lower surface of the first photoelectric conversion portion.

4. The solid-state imaging device according to claim 2, wherein the transmitting portion has a pattern surrounded by the first photoelectric conversion portion in the imaging area of the substrate.

5. The solid-state imaging device according to claim 2, wherein the transmitting portion has a pattern surrounding the first photoelectric conversion portion in the imaging area of the substrate.

6. The solid-state imaging device according to claim 1, further comprising a third photoelectric conversion portion which selectively receives incident light of a third wavelength range different than that of both the first wavelength range and the second wavelength range and performs photoelectric conversion thereof,
wherein,
the first photoelectric, conversion portion and the second photoelectric conversion portion are stacked above the third photoelectric conversion portion in the imaging area of the substrate so that the third photoelectric conversion portion receives the incident light of the third wavelength range as light transmitted via the first photoelectric conversion portion and the second photoelectric conversion portion.

7. The solid-state imaging device according to claim 6, wherein:
the first photoelectric conversion portion selectively receives green light as the light of the first wavelength range,
the second photoelectric conversion portion selectively receives blue light as the light of the second wavelength range, and
the third photoelectric conversion portion selectively receives red light as the light of the third wavelength range.

8. The solid-state imaging device according to claim 1, wherein the transmitting portion is recessed in a concave shape in an upper surface of the first photoelectric conversion portion.

9. The solid-state imaging device according to claim 1, wherein the first photoelectric conversion portion comprises an organic material.

10. A method manufacturing a solid-state imaging device comprising the step of:
manufacturing the solid-state imaging device to include at least (a) a first photoelectric conversion portion which selectively receives incident light of a first wavelength range and performs photoelectric conversion thereof and (b) a second photoelectric conversion portion which selectively receives incident light of a second wavelength range which is shorter than the first wavelength range and performs photoelectric conversion thereof, the first photoelectric conversion portion being stacked above the second photoelectric conversion portion in an imaging area of a substrate so that the second photoelectric conversion portion receives the incident light of the second wavelength range as light transmitted by the first photoelectric conversion portion,
wherein,
the step of manufacturing the solid-state imaging device includes the step of forming a transmitting portion in the first photoelectric conversion portion so that the incident light of the second wavelength range is transmitted to the second photoelectric conversion portion more than other portions,
in the step of forming of the transmitting portion, the transmitting portion is formed to include a portion satisfying an Equation (1) within a width D which is defined in a direction of the imaging area of the substrate, a refraction index n of a peripheral portion of the transmitting portion, and a longest wavelength $\lambda c$ of the second wavelength range which is selectively photoelectrically converted in the second photoelectric conversion portion, and
Equation (1) is the relationship $\lambda c/n \leqq 2D$.

11. An electronic apparatus comprising: at least
a first photoelectric conversion portion which selectively receives incident light of a first wavelength range and performs photoelectric conversion thereof; and
a second photoelectric conversion portion which selectively receives incident light of a second wavelength range which is shorter than the first wavelength range and performs photoelectric conversion thereof;
wherein,
the first photoelectric conversion portion is stacked above the second photoelectric conversion portion in an imaging area of a substrate so that the second photoelectric conversion portion receives the incident light of the second wavelength range as light transmitted via the first photoelectric conversion portion, a transmitting portion is formed in the first photoelectric conversion portion so that the incident light of the second wavelength range is transmitted to the second photoelectric conversion portion more than other portions, and the transmitting portion includes a portion satisfying an Equation (1) within a width D which is defined in a direction of the imaging area of the substrate, a refraction index n of a peripheral portion of the transmitting portion, and a longest wavelength $\lambda c$ of the second wavelength range which is selectively photoelectrically converted in the second photoelectric conversion portion, and Equation (1) is the relationship $\lambda c/n \leqq 2D$.

* * * * *